(12) United States Patent
Muranaka et al.

(10) Patent No.: US 11,604,533 B2
(45) Date of Patent: Mar. 14, 2023

(54) INPUT DEVICE, CONTROL METHOD FOR CONTROLLING INPUT DEVICE, AND RECORDING MEDIUM IN WHICH PROGRAM FOR CAUSING COMPUTER TO PERFORM CONTROL METHOD FOR CONTROLLING INPUT DEVICE

(71) Applicant: ALPS ALPINE CO., LTD., Tokyo (JP)

(72) Inventors: Tetsuo Muranaka, Miyagi (JP); Naoyuki Hatano, Miyagi (JP); Hiroshi Izumi, Miyagi (JP); Koichi Miura, Fukushima (JP); Yasuji Hagiwara, Miyagi (JP)

(73) Assignee: ALPS ALPINE CO., LTD., Tokyo (JP)

( * ) Notice: Subject to any disclaimer, the term of this patent is extended or adjusted under 35 U.S.C. 154(b) by 325 days.

(21) Appl. No.: 17/142,411

(22) Filed: Jan. 6, 2021

(65) Prior Publication Data

US 2021/0211129 A1 Jul. 8, 2021

(30) Foreign Application Priority Data

Jan. 8, 2020 (JP) .............................. JP2020-001369

(51) Int. Cl.
*G06F 3/041* (2006.01)
*G06F 3/044* (2006.01)

(52) U.S. Cl.
CPC ............ *G06F 3/0416* (2013.01); *G06F 3/044* (2013.01); *G06F 3/04166* (2019.05);
(Continued)

(58) Field of Classification Search
CPC .... G06F 3/0416; G06F 3/044; G06F 3/04166; G06F 3/04186; G06F 3/0446;
(Continued)

(56) References Cited

U.S. PATENT DOCUMENTS 10,782,829 B2 * 9/2020 Kim ..................... G06F 3/0418
2011/0043478 A1 2/2011 Matsushima
(Continued)

FOREIGN PATENT DOCUMENTS

| JP | 2017-076242 | 4/2017 |
|----|-------------|--------|
| JP | 2019-117560 | 7/2019 |

(Continued)

*Primary Examiner* — Darlene M Ritchie
(74) *Attorney, Agent, or Firm* — IPUSA, PLLC

(57) ABSTRACT

There is provided a sensor unit for detecting a proximity state of an object at N detection positions, generating a composite detection signal in conformity with the sum of N detection signals obtained as a result of detection for N detection positions, and controlling a positive or negative polarity of the detection signal having a signal level in conformity with the proximity state at each of N detection positions, a sensor control unit for controlling the sensor unit for generating M composite detection signals having N polarity patterns set at N detection signals different from each other, and a signal regeneration unit for regenerating the signal level of the N detection signal based on the M composite detection signals generated by the sensor unit.

12 Claims, 30 Drawing Sheets

(52) U.S. Cl.
CPC ........ *G06F 3/04186* (2019.05); *G06F 3/0446* (2019.05); *G06F 2203/04101* (2013.01)

(58) Field of Classification Search
CPC ........ G06F 2203/04101; H03K 17/955; H03K 2217/96073
See application file for complete search history.

(56) References Cited

U.S. PATENT DOCUMENTS

2016/0342264 A1   11/2016  Takahashi et al.
2017/0351382 A1*  12/2017  Kuo .................... G06F 3/04182
2018/0224986 A1*   8/2018  Tanaka ................ G09G 3/3666

FOREIGN PATENT DOCUMENTS

| | | |
|---|---|---|
| JP | 2019-169076 | 10/2019 |
| JP | 2019-174864 | 10/2019 |
| WO | 2011/019395 | 2/2011 |

* cited by examiner

| | $S_1$ | $S_2$ | $S_3$ | $S_4$ | $S_5$ | $S_6$ | $S_7$ | | | |
|---|---|---|---|---|---|---|---|---|---|---|
| | \multicolumn{7}{c|}{$G_1$} | | | |

| | $S_1$ | $S_2$ | $S_3$ | $S_4$ | $S_5$ | $S_6$ | $S_7$ | | | |
|---|---|---|---|---|---|---|---|---|---|---|
| $P_1$ | 1 | 1 | 1 | -1 | 1 | -1 | -1 | $PB_1^{(1)}$ | ⇒ | $a_1$ |
| $P_2$ | -1 | 1 | 1 | 1 | -1 | 1 | -1 | $PB_2^{(1)}$ | ⇒ | $a_2$ |
| $P_3$ | -1 | -1 | 1 | 1 | 1 | -1 | 1 | $PB_3^{(1)}$ | ⇒ | $a_3$ |
| $P_4$ | 1 | -1 | -1 | 1 | 1 | 1 | -1 | $PB_4^{(1)}$ | ⇒ | $a_4$ |
| $P_5$ | -1 | 1 | -1 | -1 | 1 | 1 | 1 | $PB_5^{(1)}$ | ⇒ | $a_5$ |
| $P_6$ | 1 | -1 | 1 | -1 | -1 | 1 | 1 | $PB_6^{(1)}$ | ⇒ | $a_6$ |
| $P_7$ | 1 | 1 | -1 | 1 | -1 | -1 | 1 | $PB_7^{(1)}$ | ⇒ | $a_7$ |

FIG.4B

| | $S_8$ | $S_9$ | $S_{10}$ | $S_{11}$ | $S_{12}$ | $S_{13}$ | $S_{14}$ | | | |
|---|---|---|---|---|---|---|---|---|---|---|
| | \multicolumn{7}{c|}{$G_2$} | | | |

| | $S_8$ | $S_9$ | $S_{10}$ | $S_{11}$ | $S_{12}$ | $S_{13}$ | $S_{14}$ | | | |
|---|---|---|---|---|---|---|---|---|---|---|
| $P_8$ | 1 | 1 | 1 | -1 | 1 | -1 | -1 | $PB_8^{(2)}$ | ⇒ | $a_8$ |
| $P_9$ | -1 | 1 | 1 | 1 | -1 | 1 | -1 | $PB_9^{(2)}$ | ⇒ | $a_9$ |
| $P_{10}$ | -1 | -1 | 1 | 1 | 1 | -1 | 1 | $PB_{10}^{(2)}$ | ⇒ | $a_{10}$ |
| $P_{11}$ | 1 | -1 | -1 | 1 | 1 | 1 | -1 | $PB_{11}^{(2)}$ | ⇒ | $a_{11}$ |
| $P_{12}$ | -1 | 1 | -1 | -1 | 1 | 1 | 1 | $PB_{12}^{(2)}$ | ⇒ | $a_{12}$ |
| $P_{13}$ | 1 | -1 | 1 | -1 | -1 | 1 | 1 | $PB_{13}^{(2)}$ | ⇒ | $a_{13}$ |
| $P_{14}$ | 1 | 1 | -1 | 1 | -1 | -1 | 1 | $PB_{14}^{(2)}$ | ⇒ | $a_{14}$ |

FIG.5A $$\begin{pmatrix} a_1 \\ a_2 \\ a_3 \\ a_4 \\ a_5 \\ a_6 \\ a_7 \end{pmatrix} \overset{A_1}{} = \overset{D_1}{\begin{pmatrix} 1 & 1 & 1 & -1 & 1 & -1 & -1 \\ -1 & 1 & 1 & 1 & -1 & 1 & -1 \\ -1 & -1 & 1 & 1 & 1 & -1 & 1 \\ 1 & -1 & -1 & 1 & 1 & 1 & -1 \\ -1 & 1 & -1 & -1 & 1 & 1 & 1 \\ 1 & -1 & 1 & -1 & -1 & 1 & 1 \\ 1 & 1 & -1 & 1 & -1 & -1 & 1 \end{pmatrix}} \begin{matrix} B_1^{(1)} \\ B_2^{(1)} \\ B_3^{(1)} \\ B_4^{(1)} \\ B_5^{(1)} \\ B_6^{(1)} \\ B_7^{(1)} \end{matrix} \times \overset{C_1}{\begin{pmatrix} c_1 \\ c_2 \\ c_3 \\ c_4 \\ c_5 \\ c_6 \\ c_7 \end{pmatrix}}$$

FIG.5B $$\begin{pmatrix} a_8 \\ a_9 \\ a_{10} \\ a_{11} \\ a_{12} \\ a_{13} \\ a_{14} \end{pmatrix} \overset{A_2}{} = \overset{D_2}{\begin{pmatrix} 1 & 1 & 1 & -1 & 1 & -1 & -1 \\ -1 & 1 & 1 & 1 & -1 & 1 & -1 \\ -1 & -1 & 1 & 1 & 1 & -1 & 1 \\ 1 & -1 & -1 & 1 & 1 & 1 & -1 \\ -1 & 1 & -1 & -1 & 1 & 1 & 1 \\ 1 & -1 & 1 & -1 & -1 & 1 & 1 \\ 1 & 1 & -1 & 1 & -1 & -1 & 1 \end{pmatrix}} \begin{matrix} B_8^{(2)} \\ B_9^{(2)} \\ B_{10}^{(2)} \\ B_{11}^{(2)} \\ B_{12}^{(2)} \\ B_{13}^{(2)} \\ B_{14}^{(2)} \end{matrix} \times \overset{C_2}{\begin{pmatrix} c_8 \\ c_9 \\ c_{10} \\ c_{11} \\ c_{12} \\ c_{13} \\ c_{14} \end{pmatrix}}$$

FIG.5C $$D_1^{-1} = D_2^{-1} = \begin{pmatrix} 0.25 & 0 & 0 & 0.25 & 0 & 0.25 & 0.25 \\ 0.25 & 0.25 & 0 & 0 & 0.25 & 0 & 0.25 \\ 0.25 & 0.25 & 0.25 & 0 & 0 & 0.25 & 0 \\ 0 & 0.25 & 0.25 & 0.25 & 0 & 0 & 0.25 \\ 0.25 & 0 & 0.25 & 0.25 & 0.25 & 0 & 0 \\ 0 & 0.25 & 0 & 0.25 & 0.25 & 0.25 & 0 \\ 0 & 0 & 0.25 & 0 & 0.25 & 0.25 & 0.25 \end{pmatrix}$$

FIG.6A $$4 \cdot C_1 = \begin{pmatrix} 4c_1 \\ 4c_2 \\ 4c_3 \\ 4c_4 \\ 4c_5 \\ 4c_6 \\ 4c_7 \end{pmatrix} = \begin{pmatrix} 1 & 0 & 0 & 1 & 0 & 1 & 1 \\ 1 & 1 & 0 & 0 & 1 & 0 & 1 \\ 1 & 1 & 1 & 0 & 0 & 1 & 0 \\ 0 & 1 & 1 & 1 & 0 & 0 & 1 \\ 1 & 0 & 1 & 1 & 1 & 0 & 0 \\ 0 & 1 & 0 & 1 & 1 & 1 & 0 \\ 0 & 0 & 1 & 0 & 1 & 1 & 1 \end{pmatrix} \times \begin{pmatrix} a_1 \\ a_2 \\ a_3 \\ a_4 \\ a_5 \\ a_6 \\ a_7 \end{pmatrix}$$

where the bracketed labels are $4 \cdot C_1$, $4 \cdot D_1^{-1}$, and $A_1$.

FIG.6B $$4 \cdot C_2 = \begin{pmatrix} 4c_8 \\ 4c_9 \\ 4c_{10} \\ 4c_{11} \\ 4c_{12} \\ 4c_{13} \\ 4c_{14} \end{pmatrix} = \begin{pmatrix} 1 & 0 & 0 & 1 & 0 & 1 & 1 \\ 1 & 1 & 0 & 0 & 1 & 0 & 1 \\ 1 & 1 & 1 & 0 & 0 & 1 & 0 \\ 0 & 1 & 1 & 1 & 0 & 0 & 1 \\ 1 & 0 & 1 & 1 & 1 & 0 & 0 \\ 0 & 1 & 0 & 1 & 1 & 1 & 0 \\ 0 & 0 & 1 & 0 & 1 & 1 & 1 \end{pmatrix} \times \begin{pmatrix} a_8 \\ a_9 \\ a_{10} \\ a_{11} \\ a_{12} \\ a_{13} \\ a_{14} \end{pmatrix}$$

where the bracketed labels are $4 \cdot C_2$, $4 \cdot D_2^{-1}$, and $A_2$.

| | $S_1$ | $S_2$ | $S_3$ | $S_4$ | $S_5$ | $S_6$ | $S_7$ | | |
|---|---|---|---|---|---|---|---|---|---|
| | across: $G_1$ | | | | | | | | |
| $P_1$ | 1 | 1 | 1 | −1 | 1 | −1 | −1 | $PB_1^{(1)}$ ⇒ | $a_1$ |
| $P_3$ | −1 | 1 | 1 | 1 | −1 | 1 | −1 | $PB_3^{(1)}$ ⇒ | $a_3$ |
| $P_5$ | −1 | −1 | 1 | 1 | 1 | −1 | 1 | $PB_5^{(1)}$ ⇒ | $a_5$ |
| $P_7$ | 1 | −1 | −1 | 1 | 1 | 1 | −1 | $PB_7^{(1)}$ ⇒ | $a_7$ |
| $P_9$ | −1 | 1 | −1 | −1 | 1 | 1 | 1 | $PB_9^{(1)}$ ⇒ | $a_9$ |
| $P_{11}$ | 1 | −1 | 1 | −1 | −1 | 1 | 1 | $PB_{11}^{(1)}$ ⇒ | $a_{11}$ |
| $P_{13}$ | 1 | 1 | −1 | 1 | −1 | −1 | 1 | $PB_{13}^{(1)}$ ⇒ | $a_{13}$ |

FIG.8B

| | $S_8$ | $S_9$ | $S_{10}$ | $S_{11}$ | $S_{12}$ | $S_{13}$ | $S_{14}$ | | |
|---|---|---|---|---|---|---|---|---|---|
| | across: $G_2$ | | | | | | | | |
| $P_2$ | 1 | 1 | 1 | −1 | 1 | −1 | −1 | $PB_2^{(2)}$ ⇒ | $a_2$ |
| $P_4$ | −1 | 1 | 1 | 1 | −1 | 1 | −1 | $PB_4^{(2)}$ ⇒ | $a_4$ |
| $P_6$ | −1 | −1 | 1 | 1 | 1 | −1 | 1 | $PB_6^{(2)}$ ⇒ | $a_6$ |
| $P_8$ | 1 | −1 | −1 | 1 | 1 | 1 | −1 | $PB_8^{(2)}$ ⇒ | $a_8$ |
| $P_{10}$ | −1 | 1 | −1 | −1 | 1 | 1 | 1 | $PB_{10}^{(2)}$ ⇒ | $a_{10}$ |
| $P_{12}$ | 1 | −1 | 1 | −1 | −1 | 1 | 1 | $PB_{12}^{(2)}$ ⇒ | $a_{12}$ |
| $P_{14}$ | 1 | 1 | −1 | 1 | −1 | −1 | 1 | $PB_{14}^{(2)}$ ⇒ | $a_{14}$ |

FIG.9A $$A_1 = D_1 \times C_1$$

$$\begin{pmatrix} a_1 \\ a_3 \\ a_5 \\ a_7 \\ a_9 \\ a_{11} \\ a_{13} \end{pmatrix} = \begin{pmatrix} 1 & 1 & 1 & -1 & 1 & -1 & -1 \\ -1 & 1 & 1 & 1 & -1 & 1 & -1 \\ -1 & -1 & 1 & 1 & 1 & -1 & 1 \\ 1 & -1 & -1 & 1 & 1 & 1 & -1 \\ -1 & 1 & -1 & -1 & 1 & 1 & 1 \\ 1 & -1 & 1 & -1 & -1 & 1 & 1 \\ 1 & 1 & -1 & 1 & -1 & -1 & 1 \end{pmatrix} \times \begin{pmatrix} c_1 \\ c_2 \\ c_3 \\ c_4 \\ c_5 \\ c_6 \\ c_7 \end{pmatrix}$$

Rows labeled: $B_1^{(1)}$, $B_3^{(1)}$, $B_5^{(1)}$, $B_7^{(1)}$, $B_9^{(1)}$, $B_{11}^{(1)}$, $B_{13}^{(1)}$

FIG.9B $$A_2 = D_2 \times C_2$$

$$\begin{pmatrix} a_2 \\ a_4 \\ a_6 \\ a_8 \\ a_{10} \\ a_{12} \\ a_{14} \end{pmatrix} = \begin{pmatrix} 1 & 1 & 1 & -1 & 1 & -1 & -1 \\ -1 & 1 & 1 & 1 & -1 & 1 & -1 \\ -1 & -1 & 1 & 1 & 1 & -1 & 1 \\ 1 & -1 & -1 & 1 & 1 & 1 & -1 \\ -1 & 1 & -1 & -1 & 1 & 1 & 1 \\ 1 & -1 & 1 & -1 & -1 & 1 & 1 \\ 1 & 1 & -1 & 1 & -1 & -1 & 1 \end{pmatrix} \times \begin{pmatrix} c_8 \\ c_9 \\ c_{10} \\ c_{11} \\ c_{12} \\ c_{13} \\ c_{14} \end{pmatrix}$$

Rows labeled: $B_2^{(2)}$, $B_4^{(2)}$, $B_6^{(2)}$, $B_8^{(2)}$, $B_{10}^{(2)}$, $B_{12}^{(2)}$, $B_{14}^{(2)}$

FIG.10A $$4 \cdot C_1 = \begin{pmatrix} 4c_1 \\ 4c_2 \\ 4c_3 \\ 4c_4 \\ 4c_5 \\ 4c_6 \\ 4c_7 \end{pmatrix} = \begin{pmatrix} 1 & 0 & 0 & 1 & 0 & 1 & 1 \\ 1 & 1 & 0 & 0 & 1 & 0 & 1 \\ 1 & 1 & 1 & 0 & 0 & 1 & 0 \\ 0 & 1 & 1 & 1 & 0 & 0 & 1 \\ 1 & 0 & 1 & 1 & 1 & 0 & 0 \\ 0 & 1 & 0 & 1 & 1 & 1 & 0 \\ 0 & 0 & 1 & 0 & 1 & 1 & 1 \end{pmatrix} \times \begin{pmatrix} a_1 \\ a_3 \\ a_5 \\ a_7 \\ a_9 \\ a_{11} \\ a_{13} \end{pmatrix}$$

where the left vector is labeled $4 \cdot C_1$, the matrix is labeled $4 \cdot D_1^{-1}$, and the right vector is labeled $A_1$.

FIG.10B $$4 \cdot C_2 = \begin{pmatrix} 4c_8 \\ 4c_9 \\ 4c_{10} \\ 4c_{11} \\ 4c_{12} \\ 4c_{13} \\ 4c_{14} \end{pmatrix} = \begin{pmatrix} 1 & 0 & 0 & 1 & 0 & 1 & 1 \\ 1 & 1 & 0 & 0 & 1 & 0 & 1 \\ 1 & 1 & 1 & 0 & 0 & 1 & 0 \\ 0 & 1 & 1 & 1 & 0 & 0 & 1 \\ 1 & 0 & 1 & 1 & 1 & 0 & 0 \\ 0 & 1 & 0 & 1 & 1 & 1 & 0 \\ 0 & 0 & 1 & 0 & 1 & 1 & 1 \end{pmatrix} \times \begin{pmatrix} a_2 \\ a_4 \\ a_6 \\ a_8 \\ a_{10} \\ a_{12} \\ a_{14} \end{pmatrix}$$

where the left vector is labeled $4 \cdot C_2$, the matrix is labeled $4 \cdot D_2^{-1}$, and the right vector is labeled $A_2$.

FIG. 11

|  |  | a₁ | a₂ | a₃ | a₄ | a₅ | a₆ | a₇ | a₈ | a₉ | a₁₀ | a₁₁ | a₁₂ | a₁₃ | a₁₄ |
|---|---|---|---|---|---|---|---|---|---|---|---|---|---|---|---|
| G2 | S₁₄ | 0 | 0 | 0 | 0 | 0 | 0 | 0 | 1 | 1 | 1 | 1 | 1 | 1 | 1 |
| G1 | S₁₃ | 1 | 1 | 1 | 1 | 1 | 1 | 0 | 0 | 0 | 0 | 0 | 0 | 0 | 0 |
| G2 | S₁₂ | 0 | 0 | 0 | 0 | 0 | 0 | 1 | 1 | 1 | 1 | 1 | 1 | 1 | 1 |
| G1 | S₁₁ | 1 | 1 | 1 | 1 | 1 | 1 | 0 | 0 | 0 | 0 | 0 | 0 | 0 | 0 |
| G2 | S₁₀ | 0 | 0 | 0 | 0 | 0 | 0 | 1 | 1 | 1 | 1 | 1 | 1 | 1 | 1 |
| G1 | S₉ | 1 | 1 | 1 | 1 | 1 | 1 | 0 | 0 | 0 | 0 | 0 | 0 | 0 | 0 |
| G2 | S₈ | 0 | 0 | 0 | 0 | 0 | 0 | 1 | 1 | 1 | 1 | 1 | 1 | 1 | 1 |
| G1 | S₇ | 1 | 1 | 1 | 1 | 1 | 1 | 0 | 0 | 0 | 0 | 0 | 0 | 0 | 0 |
| G2 | S₆ | 0 | 0 | 0 | 0 | 0 | 0 | 1 | 1 | 1 | 1 | 1 | 1 | 1 | 1 |
| G1 | S₅ | 1 | 1 | 1 | 1 | 1 | 1 | 0 | 0 | 0 | 0 | 0 | 0 | 0 | 0 |
| G2 | S₄ | 0 | 0 | 0 | 0 | 0 | 0 | 1 | 1 | 1 | 1 | 1 | 1 | 1 | 1 |
| G1 | S₃ | 1 | 1 | 1 | 1 | 1 | 1 | 0 | 0 | 0 | 0 | 0 | 0 | 0 | 0 |
| G2 | S₂ | 0 | 0 | 0 | 0 | 0 | 0 | 1 | 1 | 1 | 1 | 1 | 1 | 1 | 1 |
| G1 | S₁ | 1 | 1 | 1 | 1 | 1 | 1 | 0 | 0 | 0 | 0 | 0 | 0 | 0 | 0 |
|  |  | P₁ | P₂ | P₃ | P₄ | P₅ | P₆ | P₇ | P₈ | P₉ | P₁₀ | P₁₁ | P₁₂ | P₁₃ | P₁₄ |

FIG.12A

| | $G_1$ | | | | | | |
|---|---|---|---|---|---|---|---|
| | $S_1$ | $S_3$ | $S_5$ | $S_7$ | $S_9$ | $S_{11}$ | $S_{13}$ |
| $P_1$ | 1 | 1 | 1 | -1 | 1 | -1 | -1 | $PB_1^{(1)}$ ⇒ $a_1$
| $P_2$ | -1 | 1 | 1 | 1 | -1 | 1 | -1 | $PB_2^{(1)}$ ⇒ $a_2$
| $P_3$ | -1 | -1 | 1 | 1 | 1 | -1 | 1 | $PB_3^{(1)}$ ⇒ $a_3$
| $P_4$ | 1 | -1 | -1 | 1 | 1 | 1 | -1 | $PB_4^{(1)}$ ⇒ $a_4$
| $P_5$ | -1 | 1 | -1 | -1 | 1 | 1 | 1 | $PB_5^{(1)}$ ⇒ $a_5$
| $P_6$ | 1 | -1 | 1 | -1 | -1 | 1 | 1 | $PB_6^{(1)}$ ⇒ $a_6$
| $P_7$ | 1 | 1 | -1 | 1 | -1 | -1 | 1 | $PB_7^{(1)}$ ⇒ $a_7$

FIG.12B

| | $G_2$ | | | | | | |
|---|---|---|---|---|---|---|---|
| | $S_2$ | $S_4$ | $S_6$ | $S_8$ | $S_{10}$ | $S_{12}$ | $S_{14}$ |
| $P_8$ | 1 | 1 | 1 | -1 | 1 | -1 | -1 | $PB_8^{(2)}$ ⇒ $a_8$
| $P_9$ | -1 | 1 | 1 | 1 | -1 | 1 | -1 | $PB_9^{(2)}$ ⇒ $a_9$
| $P_{10}$ | -1 | -1 | 1 | 1 | 1 | -1 | 1 | $PB_{10}^{(2)}$ ⇒ $a_{10}$
| $P_{11}$ | 1 | -1 | -1 | 1 | 1 | 1 | -1 | $PB_{11}^{(2)}$ ⇒ $a_{11}$
| $P_{12}$ | -1 | 1 | -1 | -1 | 1 | 1 | 1 | $PB_{12}^{(2)}$ ⇒ $a_{12}$
| $P_{13}$ | 1 | -1 | 1 | -1 | -1 | 1 | 1 | $PB_{13}^{(2)}$ ⇒ $a_{13}$
| $P_{14}$ | 1 | 1 | -1 | 1 | -1 | -1 | 1 | $PB_{14}^{(2)}$ ⇒ $a_{14}$

FIG.13A $$A_1 = D_1 \times C_1$$

$$\begin{pmatrix} a_1 \\ a_2 \\ a_3 \\ a_4 \\ a_5 \\ a_6 \\ a_7 \end{pmatrix} = \begin{pmatrix} 1 & 1 & 1 & -1 & 1 & -1 & -1 \\ -1 & 1 & 1 & 1 & -1 & 1 & -1 \\ -1 & -1 & 1 & 1 & 1 & -1 & 1 \\ 1 & -1 & -1 & 1 & 1 & 1 & -1 \\ -1 & 1 & -1 & -1 & 1 & 1 & 1 \\ 1 & -1 & 1 & -1 & -1 & 1 & 1 \\ 1 & 1 & -1 & 1 & -1 & -1 & 1 \end{pmatrix} \begin{matrix} -B_1^{(1)} \\ -B_2^{(1)} \\ -B_3^{(1)} \\ -B_4^{(1)} \\ -B_5^{(1)} \\ -B_6^{(1)} \\ -B_7^{(1)} \end{matrix} \times \begin{pmatrix} c_1 \\ c_3 \\ c_5 \\ c_7 \\ c_9 \\ c_{11} \\ c_{13} \end{pmatrix}$$

FIG.13B $$A_2 = D_2 \times C_2$$

$$\begin{pmatrix} a_8 \\ a_9 \\ a_{10} \\ a_{11} \\ a_{12} \\ a_{13} \\ a_{14} \end{pmatrix} = \begin{pmatrix} 1 & 1 & 1 & -1 & 1 & -1 & -1 \\ -1 & 1 & 1 & 1 & -1 & 1 & -1 \\ -1 & -1 & 1 & 1 & 1 & -1 & 1 \\ 1 & -1 & -1 & 1 & 1 & 1 & -1 \\ -1 & 1 & -1 & -1 & 1 & 1 & 1 \\ 1 & -1 & 1 & -1 & -1 & 1 & 1 \\ 1 & 1 & -1 & 1 & -1 & -1 & 1 \end{pmatrix} \begin{matrix} -B_8^{(2)} \\ -B_9^{(2)} \\ -B_{10}^{(2)} \\ -B_{11}^{(2)} \\ -B_{12}^{(2)} \\ -B_{13}^{(2)} \\ -B_{14}^{(2)} \end{matrix} \times \begin{pmatrix} c_2 \\ c_4 \\ c_6 \\ c_8 \\ c_{10} \\ c_{12} \\ c_{14} \end{pmatrix}$$

FIG.14A $$4 \cdot C_1 = \begin{pmatrix} 4c_1 \\ 4c_3 \\ 4c_5 \\ 4c_7 \\ 4c_9 \\ 4c_{11} \\ 4c_{13} \end{pmatrix} = \begin{pmatrix} 1 & 0 & 0 & 1 & 0 & 1 & 1 \\ 1 & 1 & 0 & 0 & 1 & 0 & 1 \\ 1 & 1 & 1 & 0 & 0 & 1 & 0 \\ 0 & 1 & 1 & 1 & 0 & 0 & 1 \\ 1 & 0 & 1 & 1 & 1 & 0 & 0 \\ 0 & 1 & 0 & 1 & 1 & 1 & 0 \\ 0 & 0 & 1 & 0 & 1 & 1 & 1 \end{pmatrix} \times \begin{pmatrix} a_1 \\ a_2 \\ a_3 \\ a_4 \\ a_5 \\ a_6 \\ a_7 \end{pmatrix}$$

where the left vector is $4 \cdot C_1$, the matrix is $4 \cdot D_1^{-1}$, and the right vector is $A_1$.

FIG.14B $$4 \cdot C_2 = \begin{pmatrix} 4c_2 \\ 4c_4 \\ 4c_6 \\ 4c_8 \\ 4c_{10} \\ 4c_{12} \\ 4c_{14} \end{pmatrix} = \begin{pmatrix} 1 & 0 & 0 & 1 & 0 & 1 & 1 \\ 1 & 1 & 0 & 0 & 1 & 0 & 1 \\ 1 & 1 & 1 & 0 & 0 & 1 & 0 \\ 0 & 1 & 1 & 1 & 0 & 0 & 1 \\ 1 & 0 & 1 & 1 & 1 & 0 & 0 \\ 0 & 1 & 0 & 1 & 1 & 1 & 0 \\ 0 & 0 & 1 & 0 & 1 & 1 & 1 \end{pmatrix} \times \begin{pmatrix} a_8 \\ a_9 \\ a_{10} \\ a_{11} \\ a_{12} \\ a_{13} \\ a_{14} \end{pmatrix}$$

where the left vector is $4 \cdot C_2$, the matrix is $4 \cdot D_2^{-1}$, and the right vector is $A_2$.

FIG.15

FIG.17A $$\begin{pmatrix} a_1 \\ a_3 \\ a_5 \\ a_7 \\ a_9 \\ a_{11} \\ a_{13} \end{pmatrix} = \begin{pmatrix} 1 & 1 & 1 & -1 & 1 & -1 & -1 \\ -1 & 1 & 1 & 1 & -1 & 1 & -1 \\ -1 & -1 & 1 & 1 & 1 & -1 & 1 \\ 1 & -1 & -1 & 1 & 1 & 1 & -1 \\ -1 & 1 & -1 & -1 & 1 & 1 & 1 \\ 1 & -1 & 1 & -1 & -1 & 1 & 1 \\ 1 & 1 & -1 & 1 & -1 & -1 & 1 \end{pmatrix} \times \begin{pmatrix} c_1 \\ c_3 \\ c_5 \\ c_7 \\ c_9 \\ c_{11} \\ c_{13} \end{pmatrix}$$

$A_1$, $D_1$ (with rows $B_1^{(1)}, B_3^{(1)}, B_5^{(1)}, B_7^{(1)}, B_9^{(1)}, B_{11}^{(1)}, B_{13}^{(1)}$), $C_1$

FIG.17B $$\begin{pmatrix} a_2 \\ a_4 \\ a_6 \\ a_8 \\ a_{10} \\ a_{12} \\ a_{14} \end{pmatrix} = \begin{pmatrix} 1 & 1 & 1 & -1 & 1 & -1 & -1 \\ -1 & 1 & 1 & 1 & -1 & 1 & -1 \\ -1 & -1 & 1 & 1 & 1 & -1 & 1 \\ 1 & -1 & -1 & 1 & 1 & 1 & -1 \\ -1 & 1 & -1 & -1 & 1 & 1 & 1 \\ 1 & -1 & 1 & -1 & -1 & 1 & 1 \\ 1 & 1 & -1 & 1 & -1 & -1 & 1 \end{pmatrix} \times \begin{pmatrix} c_2 \\ c_4 \\ c_6 \\ c_8 \\ c_{10} \\ c_{12} \\ c_{14} \end{pmatrix}$$

$A_2$, $D_2$ (with rows $B_2^{(2)}, B_4^{(2)}, B_6^{(2)}, B_8^{(2)}, B_{10}^{(2)}, B_{12}^{(2)}, B_{14}^{(2)}$), $C_2$

FIG.18A $$4 \cdot C_1 = \begin{pmatrix} 4c_1 \\ 4c_3 \\ 4c_5 \\ 4c_7 \\ 4c_9 \\ 4c_{11} \\ 4c_{13} \end{pmatrix} = \begin{pmatrix} 1 & 0 & 0 & 1 & 0 & 1 & 1 \\ 1 & 1 & 0 & 0 & 1 & 0 & 1 \\ 1 & 1 & 1 & 0 & 0 & 1 & 0 \\ 0 & 1 & 1 & 1 & 0 & 0 & 1 \\ 1 & 0 & 1 & 1 & 1 & 0 & 0 \\ 0 & 1 & 0 & 1 & 1 & 1 & 0 \\ 0 & 0 & 1 & 0 & 1 & 1 & 1 \end{pmatrix} \times \begin{pmatrix} a_1 \\ a_3 \\ a_5 \\ a_7 \\ a_9 \\ a_{11} \\ a_{13} \end{pmatrix}$$

where $4 \cdot C_1$ is the left vector, $4 \cdot D_1^{-1}$ is the matrix, and $A_1$ is the right vector.

FIG.18B $$4 \cdot C_2 = \begin{pmatrix} 4c_2 \\ 4c_4 \\ 4c_6 \\ 4c_8 \\ 4c_{10} \\ 4c_{12} \\ 4c_{14} \end{pmatrix} = \begin{pmatrix} 1 & 0 & 0 & 1 & 0 & 1 & 1 \\ 1 & 1 & 0 & 0 & 1 & 0 & 1 \\ 1 & 1 & 1 & 0 & 0 & 1 & 0 \\ 0 & 1 & 1 & 1 & 0 & 0 & 1 \\ 1 & 0 & 1 & 1 & 1 & 0 & 0 \\ 0 & 1 & 0 & 1 & 1 & 1 & 0 \\ 0 & 0 & 1 & 0 & 1 & 1 & 1 \end{pmatrix} \times \begin{pmatrix} a_2 \\ a_4 \\ a_6 \\ a_8 \\ a_{10} \\ a_{12} \\ a_{14} \end{pmatrix}$$

where $4 \cdot C_2$ is the left vector, $4 \cdot D_2^{-1}$ is the matrix, and $A_2$ is the right vector.

FIG.19

| | G1/G2 | G2 | G1 | G2 | G1 | G2 | G1 | G2 | G1 | G2 | G1 | G1/G2 | | |
|---|---|---|---|---|---|---|---|---|---|---|---|---|---|---|
| | $S_1$ | $S_2$ | $S_3$ | $S_4$ | $S_5$ | $S_6$ | $S_7$ | $S_8$ | $S_9$ | $S_{10}$ | $S_{11}$ | $S_{12}$ | | |
| $P_1$ | 1 | 0 | 1 | 0 | 1 | 0 | −1 | 0 | 1 | 0 | −1 | −1 | ⇒ | $a_1$ |
| $P_2$ | −1 | 0 | 1 | 0 | 1 | 0 | 1 | 0 | −1 | 0 | 1 | −1 | ⇒ | $a_2$ |
| $P_3$ | −1 | 0 | −1 | 0 | 1 | 0 | 1 | 0 | 1 | 0 | −1 | 1 | ⇒ | $a_3$ |
| $P_4$ | 1 | 0 | −1 | 0 | −1 | 0 | 1 | 0 | 1 | 0 | 1 | −1 | ⇒ | $a_4$ |
| $P_5$ | −1 | 0 | 1 | 0 | −1 | 0 | −1 | 0 | 1 | 0 | 1 | 1 | ⇒ | $a_5$ |
| $P_6$ | 1 | 0 | −1 | 0 | 1 | 0 | −1 | 0 | −1 | 0 | 1 | 1 | ⇒ | $a_6$ |
| $P_7$ | 1 | 0 | 1 | 0 | −1 | 0 | 1 | 0 | −1 | 0 | −1 | 1 | ⇒ | $a_7$ |
| $P_8$ | 1 | 1 | 0 | 1 | 0 | −1 | 0 | 1 | 0 | −1 | 0 | −1 | ⇒ | $a_8$ |
| $P_9$ | −1 | 1 | 0 | 1 | 0 | 1 | 0 | −1 | 0 | 1 | 0 | −1 | ⇒ | $a_9$ |
| $P_{10}$ | −1 | −1 | 0 | 1 | 0 | 1 | 0 | 1 | 0 | −1 | 0 | 1 | ⇒ | $a_{10}$ |
| $P_{11}$ | 1 | −1 | 0 | −1 | 0 | 1 | 0 | 1 | 0 | 1 | 0 | −1 | ⇒ | $a_{11}$ |
| $P_{12}$ | −1 | 1 | 0 | −1 | 0 | −1 | 0 | 1 | 0 | 1 | 0 | 1 | ⇒ | $a_{12}$ |
| $P_{13}$ | 1 | −1 | 0 | 1 | 0 | −1 | 0 | −1 | 0 | 1 | 0 | 1 | ⇒ | $a_{13}$ |
| $P_{14}$ | 1 | 1 | 0 | −1 | 0 | 1 | 0 | −1 | 0 | −1 | 0 | 1 | ⇒ | $a_{14}$ |

FIG.20A

| $G_1$ | | | | | | |
|---|---|---|---|---|---|---|
| $S_1$ | $S_3$ | $S_5$ | $S_7$ | $S_9$ | $S_{11}$ | $S_{12}$ |

| | $S_1$ | $S_3$ | $S_5$ | $S_7$ | $S_9$ | $S_{11}$ | $S_{12}$ | | |
|---|---|---|---|---|---|---|---|---|---|
| $P_1$ | 1 | 1 | 1 | −1 | 1 | −1 | −1 | $PB_1^{(1)}$ ⇒ | $a_1$ |
| $P_2$ | −1 | 1 | 1 | 1 | −1 | 1 | −1 | $PB_2^{(1)}$ ⇒ | $a_2$ |
| $P_3$ | −1 | −1 | 1 | 1 | 1 | −1 | 1 | $PB_3^{(1)}$ ⇒ | $a_3$ |
| $P_4$ | 1 | −1 | −1 | 1 | 1 | 1 | −1 | $PB_4^{(1)}$ ⇒ | $a_4$ |
| $P_5$ | −1 | 1 | −1 | −1 | 1 | 1 | 1 | $PB_5^{(1)}$ ⇒ | $a_5$ |
| $P_6$ | 1 | −1 | 1 | −1 | −1 | 1 | 1 | $PB_6^{(1)}$ ⇒ | $a_6$ |
| $P_7$ | 1 | 1 | −1 | 1 | −1 | −1 | 1 | $PB_7^{(1)}$ ⇒ | $a_7$ |

FIG.20B

| $G_2$ | | | | | | |
|---|---|---|---|---|---|---|
| $S_1$ | $S_2$ | $S_4$ | $S_6$ | $S_8$ | $S_{10}$ | $S_{12}$ |

| | $S_1$ | $S_2$ | $S_4$ | $S_6$ | $S_8$ | $S_{10}$ | $S_{12}$ | | |
|---|---|---|---|---|---|---|---|---|---|
| $P_8$ | 1 | 1 | 1 | −1 | 1 | −1 | −1 | $PB_8^{(2)}$ ⇒ | $a_8$ |
| $P_9$ | −1 | 1 | 1 | 1 | −1 | 1 | −1 | $PB_9^{(2)}$ ⇒ | $a_9$ |
| $P_{10}$ | −1 | −1 | 1 | 1 | 1 | −1 | 1 | $PB_{10}^{(2)}$ ⇒ | $a_{10}$ |
| $P_{11}$ | 1 | −1 | −1 | 1 | 1 | 1 | −1 | $PB_{11}^{(2)}$ ⇒ | $a_{11}$ |
| $P_{12}$ | −1 | 1 | −1 | −1 | 1 | 1 | 1 | $PB_{12}^{(2)}$ ⇒ | $a_{12}$ |
| $P_{13}$ | 1 | −1 | 1 | −1 | −1 | 1 | 1 | $PB_{13}^{(2)}$ ⇒ | $a_{13}$ |
| $P_{14}$ | 1 | 1 | −1 | 1 | −1 | −1 | 1 | $PB_{14}^{(2)}$ ⇒ | $a_{14}$ |

FIG.21A $$A_1 \quad D_1 \quad C_1$$

$$\begin{pmatrix} a_1 \\ a_2 \\ a_3 \\ a_4 \\ a_5 \\ a_6 \\ a_7 \end{pmatrix} = \begin{pmatrix} 1 & 1 & 1 & -1 & 1 & -1 & -1 \\ -1 & 1 & 1 & 1 & -1 & 1 & -1 \\ -1 & -1 & 1 & 1 & 1 & -1 & 1 \\ 1 & -1 & -1 & 1 & 1 & 1 & -1 \\ -1 & 1 & -1 & -1 & 1 & 1 & 1 \\ 1 & -1 & 1 & -1 & -1 & 1 & 1 \\ 1 & 1 & -1 & 1 & -1 & -1 & 1 \end{pmatrix} \times \begin{pmatrix} c_1 \\ c_3 \\ c_5 \\ c_7 \\ c_9 \\ c_{11} \\ c_{12} \end{pmatrix}$$

with rows labeled $B_1^{(1)}, B_2^{(1)}, B_3^{(1)}, B_4^{(1)}, B_5^{(1)}, B_6^{(1)}, B_7^{(1)}$

FIG.21B $$A_2 \quad D_2 \quad C_2$$

$$\begin{pmatrix} a_8 \\ a_9 \\ a_{10} \\ a_{11} \\ a_{12} \\ a_{13} \\ a_{14} \end{pmatrix} = \begin{pmatrix} 1 & 1 & 1 & -1 & 1 & -1 & -1 \\ -1 & 1 & 1 & 1 & -1 & 1 & -1 \\ -1 & -1 & 1 & 1 & 1 & -1 & 1 \\ 1 & -1 & -1 & 1 & 1 & 1 & -1 \\ -1 & 1 & -1 & -1 & 1 & 1 & 1 \\ 1 & -1 & 1 & -1 & -1 & 1 & 1 \\ 1 & 1 & -1 & 1 & -1 & -1 & 1 \end{pmatrix} \times \begin{pmatrix} c_1 \\ c_2 \\ c_4 \\ c_6 \\ c_8 \\ c_{10} \\ c_{12} \end{pmatrix}$$

with rows labeled $B_8^{(2)}, B_9^{(2)}, B_{10}^{(2)}, B_{11}^{(2)}, B_{12}^{(2)}, B_{13}^{(2)}, B_{14}^{(2)}$

FIG.22A $$4 \cdot C_1 = \begin{pmatrix} 4c_1 \\ 4c_3 \\ 4c_5 \\ 4c_7 \\ 4c_9 \\ 4c_{11} \\ 4c_{12} \end{pmatrix} = \begin{pmatrix} 1 & 0 & 0 & 1 & 0 & 1 & 1 \\ 1 & 1 & 0 & 0 & 1 & 0 & 1 \\ 1 & 1 & 1 & 0 & 0 & 1 & 0 \\ 0 & 1 & 1 & 1 & 0 & 0 & 1 \\ 1 & 0 & 1 & 1 & 1 & 0 & 0 \\ 0 & 1 & 0 & 1 & 1 & 1 & 0 \\ 0 & 0 & 1 & 0 & 1 & 1 & 1 \end{pmatrix} \times \begin{pmatrix} a_1 \\ a_2 \\ a_3 \\ a_4 \\ a_5 \\ a_6 \\ a_7 \end{pmatrix}$$

where the bracketed labels denote $4 \cdot C_1$, $4 \cdot D_1^{-1}$, and $A_1$.

FIG.22B $$4 \cdot C_2 = \begin{pmatrix} 4c_1 \\ 4c_2 \\ 4c_4 \\ 4c_6 \\ 4c_8 \\ 4c_{10} \\ 4c_{12} \end{pmatrix} = \begin{pmatrix} 1 & 0 & 0 & 1 & 0 & 1 & 1 \\ 1 & 1 & 0 & 0 & 1 & 0 & 1 \\ 1 & 1 & 1 & 0 & 0 & 1 & 0 \\ 0 & 1 & 1 & 1 & 0 & 0 & 1 \\ 1 & 0 & 1 & 1 & 1 & 0 & 0 \\ 0 & 1 & 0 & 1 & 1 & 1 & 0 \\ 0 & 0 & 1 & 0 & 1 & 1 & 1 \end{pmatrix} \times \begin{pmatrix} a_8 \\ a_9 \\ a_{10} \\ a_{11} \\ a_{12} \\ a_{13} \\ a_{14} \end{pmatrix}$$

where the bracketed labels denote $4 \cdot C_2$, $4 \cdot D_2^{-1}$, and $A_2$.

| | $G_1$ | | | | |
|---|---|---|---|---|---|
| | $S_1$ | $S_2$ | $S_3$ | $S_4$ | $S_5$ |
| $P_1$ | 1 | 1 | −1 | −1 | 1 | $\sim PB_1^{(1)}$ ⇒ $a_1$
| $P_2$ | 1 | 1 | 1 | −1 | −1 | $\sim PB_2^{(1)}$ ⇒ $a_2$
| $P_3$ | −1 | 1 | 1 | 1 | −1 | $\sim PB_3^{(1)}$ ⇒ $a_3$
| $P_4$ | −1 | −1 | 1 | 1 | 1 | $\sim PB_4^{(1)}$ ⇒ $a_4$
| $P_5$ | 1 | −1 | −1 | 1 | 1 | $\sim PB_5^{(1)}$ ⇒ $a_5$

FIG.24B

| | $G_2$ | | | | | | |
|---|---|---|---|---|---|---|---|
| | $S_5$ | $S_6$ | $S_7$ | $S_8$ | $S_9$ | $S_{10}$ | $S_{11}$ |
| $P_6$ | 1 | 1 | 1 | −1 | 1 | −1 | −1 | $\sim PB_6^{(2)}$ ⇒ $a_6$
| $P_7$ | −1 | 1 | 1 | 1 | −1 | 1 | −1 | $\sim PB_7^{(2)}$ ⇒ $a_7$
| $P_8$ | −1 | −1 | 1 | 1 | 1 | −1 | 1 | $\sim PB_8^{(2)}$ ⇒ $a_8$
| $P_9$ | 1 | −1 | −1 | 1 | 1 | 1 | −1 | $\sim PB_9^{(2)}$ ⇒ $a_9$
| $P_{10}$ | −1 | 1 | −1 | −1 | 1 | 1 | 1 | $\sim PB_{10}^{(2)}$ ⇒ $a_{10}$
| $P_{11}$ | 1 | −1 | 1 | −1 | −1 | 1 | 1 | $\sim PB_{11}^{(2)}$ ⇒ $a_{11}$
| $P_{12}$ | 1 | 1 | −1 | 1 | −1 | −1 | 1 | $\sim PB_{12}^{(2)}$ ⇒ $a_{12}$

FIG.24C

| | $G_3$ | | | | |
|---|---|---|---|---|---|
| | $S_{12}$ | $S_{13}$ | $S_{14}$ | $S_{15}$ | $S_{16}$ |
| $P_{13}$ | 1 | 1 | −1 | −1 | 1 | $\sim PB_{13}^{(3)}$ ⇒ $a_{13}$
| $P_{14}$ | 1 | 1 | 1 | −1 | −1 | $\sim PB_{14}^{(3)}$ ⇒ $a_{14}$
| $P_{15}$ | −1 | 1 | 1 | 1 | −1 | $\sim PB_{15}^{(3)}$ ⇒ $a_{15}$
| $P_{16}$ | −1 | −1 | 1 | 1 | 1 | $\sim PB_{16}^{(3)}$ ⇒ $a_{16}$
| $P_{17}$ | 1 | −1 | −1 | 1 | 1 | $\sim PB_{17}^{(3)}$ ⇒ $a_{17}$

FIG.25A $$\begin{pmatrix} a_1 \\ a_2 \\ a_3 \\ a_4 \\ a_5 \end{pmatrix} \overset{A_1}{} = \begin{pmatrix} 1 & 1 & -1 & -1 & 1 \\ 1 & 1 & 1 & -1 & -1 \\ -1 & 1 & 1 & 1 & -1 \\ -1 & -1 & 1 & 1 & 1 \\ 1 & -1 & -1 & 1 & 1 \end{pmatrix} \overset{D_1}{} \begin{matrix} \cdot B_1^{(1)} \\ \cdot B_2^{(1)} \\ \cdot B_3^{(1)} \\ \cdot B_4^{(1)} \\ \cdot B_5^{(1)} \end{matrix} \times \begin{pmatrix} c_1 \\ c_2 \\ c_3 \\ c_4 \\ c_5 \end{pmatrix} \overset{C_1}{}$$

FIG.25B $$\begin{pmatrix} a_6 \\ a_7 \\ a_8 \\ a_9 \\ a_{10} \\ a_{11} \\ a_{12} \end{pmatrix} \overset{A_2}{} = \begin{pmatrix} 1 & 1 & 1 & -1 & 1 & -1 & -1 \\ -1 & 1 & 1 & 1 & -1 & 1 & -1 \\ -1 & -1 & 1 & 1 & 1 & -1 & 1 \\ 1 & -1 & -1 & 1 & 1 & 1 & -1 \\ -1 & 1 & -1 & -1 & 1 & 1 & 1 \\ 1 & -1 & 1 & -1 & -1 & 1 & 1 \\ 1 & 1 & -1 & 1 & -1 & -1 & 1 \end{pmatrix} \overset{D_2}{} \begin{matrix} \cdot B_6^{(2)} \\ \cdot B_7^{(2)} \\ \cdot B_8^{(2)} \\ \cdot B_9^{(2)} \\ \cdot B_{10}^{(2)} \\ \cdot B_{11}^{(2)} \\ \cdot B_{12}^{(2)} \end{matrix} \times \begin{pmatrix} c_5 \\ c_6 \\ c_7 \\ c_8 \\ c_9 \\ c_{10} \\ c_{11} \end{pmatrix} \overset{C_2}{}$$

FIG.25C $$\begin{pmatrix} a_{13} \\ a_{14} \\ a_{15} \\ a_{16} \\ a_{17} \end{pmatrix} \overset{A_3}{} = \begin{pmatrix} 1 & 1 & -1 & -1 & 1 \\ 1 & 1 & 1 & -1 & -1 \\ -1 & 1 & 1 & 1 & -1 \\ -1 & -1 & 1 & 1 & 1 \\ 1 & -1 & -1 & 1 & 1 \end{pmatrix} \overset{D_3}{} \begin{matrix} \cdot B_{13}^{(3)} \\ \cdot B_{14}^{(3)} \\ \cdot B_{15}^{(3)} \\ \cdot B_{16}^{(3)} \\ \cdot B_{17}^{(3)} \end{matrix} \times \begin{pmatrix} c_{12} \\ c_{13} \\ c_{14} \\ c_{15} \\ c_{16} \end{pmatrix} \overset{C_3}{}$$

FIG.26A $$D_1^{-1} = D_3^{-1} = \begin{pmatrix} 0 & 0.5 & 0 & 0 & 0.5 \\ 0.5 & 0 & 0.5 & 0 & 0 \\ 0 & 0.5 & 0 & 0.5 & 0 \\ 0 & 0 & 0.5 & 0 & 0.5 \\ 0.5 & 0 & 0 & 0.5 & 0 \end{pmatrix}$$

FIG.26B $$D_2^{-1} = \begin{pmatrix} 0.25 & 0 & 0 & 0.25 & 0 & 0.25 & 0.25 \\ 0.25 & 0.25 & 0 & 0 & 0.25 & 0 & 0.25 \\ 0.25 & 0.25 & 0.25 & 0 & 0 & 0.25 & 0 \\ 0 & 0.25 & 0.25 & 0.25 & 0 & 0 & 0.25 \\ 0.25 & 0 & 0.25 & 0.25 & 0.25 & 0 & 0 \\ 0 & 0.25 & 0 & 0.25 & 0.25 & 0.25 & 0 \\ 0 & 0 & 0.25 & 0 & 0.25 & 0.25 & 0.25 \end{pmatrix}$$

FIG.27A $$2 \cdot C_1 = \begin{pmatrix} 2c_1 \\ 2c_2 \\ 2c_3 \\ 2c_4 \\ 2c_5 \end{pmatrix} = \begin{pmatrix} 0 & 1 & 0 & 0 & 1 \\ 1 & 0 & 1 & 0 & 0 \\ 0 & 1 & 0 & 1 & 0 \\ 0 & 0 & 1 & 0 & 1 \\ 1 & 0 & 0 & 1 & 0 \end{pmatrix} \times \begin{pmatrix} a_1 \\ a_2 \\ a_3 \\ a_4 \\ a_5 \end{pmatrix}$$

where $4 \cdot C_1$ labels the left vector, $4 \cdot D_1^{-1}$ labels the matrix, and $A_1$ labels the right vector.

FIG.27B $$2 \cdot C_2 = \begin{pmatrix} 4c_5 \\ 4c_6 \\ 4c_7 \\ 4c_8 \\ 4c_9 \\ 4c_{10} \\ 4c_{11} \end{pmatrix} = \begin{pmatrix} 1 & 0 & 0 & 1 & 0 & 1 & 1 \\ 1 & 1 & 0 & 0 & 1 & 0 & 1 \\ 1 & 1 & 1 & 0 & 0 & 1 & 0 \\ 0 & 1 & 1 & 1 & 0 & 0 & 1 \\ 1 & 0 & 1 & 1 & 1 & 0 & 0 \\ 0 & 1 & 0 & 1 & 1 & 1 & 0 \\ 0 & 0 & 1 & 0 & 1 & 1 & 1 \end{pmatrix} \times \begin{pmatrix} a_6 \\ a_7 \\ a_8 \\ a_9 \\ a_{10} \\ a_{11} \\ a_{12} \end{pmatrix}$$

where $4 \cdot C_2$ labels the left vector, $4 \cdot D_2^{-1}$ labels the matrix, and $A_2$ labels the right vector.

FIG.27C $$2 \cdot C_3 = \begin{pmatrix} 2c_{12} \\ 2c_{13} \\ 2c_{14} \\ 2c_{15} \\ 2c_{16} \end{pmatrix} = \begin{pmatrix} 0 & 1 & 0 & 0 & 1 \\ 1 & 0 & 1 & 0 & 0 \\ 0 & 1 & 0 & 1 & 0 \\ 0 & 0 & 1 & 0 & 1 \\ 1 & 0 & 0 & 1 & 0 \end{pmatrix} \times \begin{pmatrix} a_{13} \\ a_{14} \\ a_{15} \\ a_{16} \\ a_{17} \end{pmatrix}$$

where $4 \cdot C_3$ labels the left vector, $4 \cdot D_3^{-1}$ labels the matrix, and $A_3$ labels the right vector.

INPUT DEVICE, CONTROL METHOD FOR CONTROLLING INPUT DEVICE, AND RECORDING MEDIUM IN WHICH PROGRAM FOR CAUSING COMPUTER TO PERFORM CONTROL METHOD FOR CONTROLLING INPUT DEVICE

CROSS-REFERENCE TO RELATED APPLICATIONS

The present application claims priority under 35 U.S.C. § 119 to Japanese Patent Application No. 2020-001369, filed Jan. 8, 2020, the contents of which are incorporated herein by reference in their entirety.

BACKGROUND OF THE INVENTION

1. Field of the Invention

This disclosure relates to an input device, a control method for controlling the input device, and a recording medium in which a program for causing a computer to perform a method for controlling that input device is recorded.

2. Description of the Related Art

There is an input device that detects proximity of an operation object, such as a finger, by measuring a physical quantity, such as an electric capacitance, at a plurality of detection positions in a detection area. Such an input device includes, for example, a plurality of parallel drive electrodes disposed on one layer and a plurality of parallel detection electrodes disposed on another layer, where the drive electrodes and the detection electrodes intersect at the electrode unit.

A driving method for acquiring the electrostatic capacitances of a plurality of detection positions is encoding drive. In the encoding drive, for example, a drive signal of either positive or negative polarity is applied simultaneously to a plurality of drive electrodes. The signal output via the detection electrode is the sum (composite detection signal) of the detection signal of the electrostatic capacitance at each detection position. The composite detection signal is measured repeatedly by the number of detection positions (the number of drive electrodes) while changing the polarity pattern of the drive signal. Then, the electrostatic capacitance at each detection position is calculated based on the obtained plurality of composite detection signals and the pattern of the polarity of the driving signal. Because the composite detection signal is the sum of a plurality of detection signals, the influence of noise included in the detection signal can be reduced compared to an ordinary driving method of acquiring the detection signal one at a time.

PRIOR ART DOCUMENTS

Patent Documents

[Patent Document 1]
   US2011/0043478A1
[Patent Document 2]
   WO2011/019395A1
[Patent Document 3]
   US2016/0342264A1
[Patent Document 4]
   Japanese Laid-open Patent Application No. 2017-076242
[Patent Document 5]
   Japanese Laid-open Patent Application No. 2019-117560
[Patent Document 6]
   Japanese Laid-open Patent Application No. 2019-169076
[Patent Document 7]
   Japanese Laid-open Patent Application No. 2019-174864

SUMMARY OF THE INVENTION

In an encoding drive, an electrostatic capacitance at each detection position is calculated by calculating the product of the matrix of the composite detection signal obtained from multiple measurements and the inverse matrix derived from the drive matrix representing the pattern of the polarity of the drive signal. Because the operation of the product of the matrix is stressful, the drive matrix is required to be selected so as to simplify the operation as much as possible. Therefore, in the above-described Patent Documents 1 to 7, a method of using an Adamar matrix or a matrix of variations thereof as a driving matrix has been examined.

In the encoding drive, it is desirable to make the number of positive drive signals applied to the plurality of drive electrodes simultaneously as close as possible to the number of negative drive signals in a single measurement of the detection signal. As a result, the level of the composite detection signal (the sum of the detection signals) decreases, so that the dynamic range required in the circuit for processing the composite detection signal is suppressed, and the detection sensitivity is easily increased. In addition, by balancing the number of positive drive signals and the number of negative drive signals, the electric field caused by the drive signal is offset and reduced, thereby reducing the total radiation noise. Therefore, in selecting the driving matrix, it is necessary to consider that the difference between the number of positive driving signals applied to the plurality of drive electrodes at the same time and the number of negative driving signals becomes smaller.

However, there are only a limited number of drive matrices which have inverse matrices which simplify the calculation of the product and which can achieve a polarity pattern in which the difference between the number of positive drive signals and the number of negative drive signals is reduced. That is, the drive matrix of the above-described good nature has little variation in size. Therefore, there is a disadvantage that it is difficult to select a drive matrix having an appropriate size in conformity with various detection positions.

Accordingly, the present disclosure discloses an input device capable of increasing the degree of freedom in selecting a matrix defining a polarity pattern of a plurality of detection signals when the original detection signal is regenerated from the sum of a plurality of detection signals obtained at a plurality of detection positions, a control method of the input device, and a program for causing a computer to execute a control method of the input device.

An input device for inputting information in conformity with a proximity state of an object at a plurality of detection positions includes a sensor unit which can detect the proximity state of the object at N detection positions, generating composite detection signal corresponding to the sum of N detection signals obtained as a result of the detection for the N detection positions, and controlling a positive or negative polarity of the detection signal having a signal level corresponding to the proximity state at each of the N detection positions; at least one processor; and a memory in which a program to be executed by the at least one processor;

wherein, when the at least one processor executes the program, the at least one processor performs a sensor control for controlling the sensor unit so as to generate the M composite detection signals (M is an integer of N or greater) having a polarity pattern of the N polarities that are set to N detection signals differ from one another, and signal regeneration of regenerating the signal level of the N detection signals based on the M composite detection signals generated by the sensor unit, wherein each of the N detection positions belongs to a portion of r-th detection position groups, the r-th detection position groups includes a 1st detection position group to a R-th detection position group, a r-th detection position group (r represents an integer from 1 to R), K(r) detection positions (K(r) represents an integer of 2 or greater) includes the detection position, K(r) polarities to be set to the K(r) detection signals obtained for the K(r) detection positions that belong to the r-th detection position group is called a r-th partial polarity pattern, the positive or negative polarity set to the detection signal is represented by "1" or "−1", the polarity set to the detection signal that is not added to the composite detection signal is represented by "0", the r-th partial polarity pattern is represented by the 1-row K(r)-columns r-th partial matrix respectively having values of "1", "−1", or "0", each of the M composite detection signals corresponds to any one of the r-th detection position groups, and K(r) composite detection signals correspond to the r-th detection position group, K(r) composite detection signals correspond to the r-th detection position group, each of the K(r) polarity patterns used to generate the K(r) composite detection signals includes the one r-th partial polarity pattern and all the polarities other than the one r-th partial polarity pattern are "0", the K(r) r-th partial polarity patterns included in the K(r) polarity pattern are represented by the K(r)-rows K(r)-columns r-th polarity pattern matrix including the K(r) r-th partial matrices, and the at least one processor regenerates, in a case where the signal regeneration is performed, the signal levels of the K(r) detection signals obtained for the K(r) detection positions belonging to the r-th detection position group based on a calculation corresponding to a multiplication of an inverse matrix with respect to the r-th polarity pattern matrix and a K(r)-rows 1-column composite detection signal matrix having the K(r) composite detection signals as an element.

The input device according to this first aspect has a sensor unit capable of detecting proximity states of objects in N detection positions, generating composite detection signals corresponding to the sum of N detection signals obtained as a result of the detection for the N detection positions, and controlling the positive or negative polarity of the detection signals having a signal level corresponding to the proximity state at each of the N detection positions, one or greater processors, and a memory storing programs executed by the at least one processor. When the program is executed, the at least one processor perform sensor control for controlling the sensor unit so as to generate the composite detection signals of the M units (where M is an integer of N or greater) having the polarity pattern of N polarities set to the N detection signals different from each other, and signal regeneration for regenerating the signal level of the N detection signals based on the M composite detection signals generated by the sensor unit. Each of the N detection positions belongs to a portion of the r-th detection position group. The r-th detection position groups include the 1st detection position group and the r-th detection position group. In the r-th detection position group (r is an integer from 1 to R), K(r) (K(r) is an integer from 2 or greater) belongs to the above-mentioned electrode unit. The K(r) polarity set to be set to the K(r) detection signal obtained for the K(r) detection positions belonging to the r-th detection position group is called a r-th partial polarity pattern. The positive or negative polarity set in the detection signal is represented by "1" or "−1", and the polarity set in the detection signal that is not added to the composite detection signal is represented by "0". The r-partial pattern is represented by the r-partial matrix of one row of K(r) columns including K(r) elements having a value of "1", "−1", or "0", respectively. Each of the M composite detection signals corresponds to any one of the R detection position groups, and K(r) composite detection signals correspond to the r-th detection position group. Each of the K(r) polarity patterns used to generate the K(r) composite detection signal includes one of the r-th partial polarity patterns and all the polarities other than the r-th partial polarity pattern are "0". The r-polarity pattern of K(r) included in the K(r) polarity pattern is represented by the K(r)-rows K(r)-columns r-th polarity pattern matrix including the K(r) partial matrix. When performing the signal regeneration, the at least one processor regenerate the signal level of the K(r) detection signal obtained for the K(r) detection positions belonging to the r-th detection position group based on an operation equivalent to a multiplication of the inverse matrix with respect to the r-th polarity pattern matrix and the K(r) composite detection signal matrix with the K(r) composite detection signals as an element.

According to the input device of the first side, K(r) of the composite detection signals that are the same as the number of the detection positions included in the r-th detection position group correspond to the r-th detection position group. Each of the K(r) polarity patterns used to generate the K(r) composite detection signal includes a single r-th partial polarity pattern, and all polarities other than the first r-th partial polarity pattern are "0". For this reason, each of the K(r) composite detection signals corresponding to the r-th detection position group becomes a signal that is generated based on the r-th partial polarity pattern and the K(r) detection signals obtained for the K(r) detection positions belonging to the r-th detection position group, and is generated independently of the partial polarity pattern other than the r-th partial polarity pattern. The signal, level of the K(r) detection signal obtained for the K(r) electrode unit belonging to the r-th detection position group is regenerated based on an operation corresponding to a multiplication of the inverse matrix of the r-th polarity pattern matrix configured by the r partial matrix representing the r-th partial polarity pattern with the K(r) composite detection signal as an element. Accordingly, it is possible to use independent polarity pattern matrices (the 1st polarity pattern matrix to the r-th polarity pattern matrix) for the r-th detection position groups.

Preferably, the at least one processor control the sensor unit so that when performing the sensor control, the M composite detection signals are generated sequentially, and two composite detection signals corresponding to different groups of detection positions are generated consecutively back and forth. According to this arrangement, when noise is concentrated in some time zones, the effect of noise on the regenerated signal level is likely to be dispersed among a plurality of the detection position groups.

Preferably, the N detection positions are aligned in one direction, and the two adjacent detection positions belong to the different detection positions. According to this arrangement, when noise is concentrated and propagated in some locations, the effect of noise on the regenerated signal level is likely to be dispersed among a plurality of the detection position groups.

Preferably, the N detection positions are aligned in one direction, and the two adjacent detection positions belong to the different detection positions. When the at least one processor perform the sensor control, the detection process of generating the M composite detection signals sequentially is repeated periodically, and in the detection process of one cycle, K(r) composite detection signals corresponding to the r-th detection position group are continuously generated. When the at least one processor perform the signal regeneration, each time K(r) of the composite detection signals corresponding to the r-th detection position group are generated, the at least one processor regenerates the signal level at the K(r) detection positions belonging to the r-th detection position group. According to this structure, because two adjacent detection positions belong to different detection positions in the N detection positions aligned in one direction, a plurality of detection positions belonging to each detection position group are spatially dispersed. In the detection process of one cycle, each time K(r) of the composite detection signals corresponding to the r-th detection position group are continuously generated, the signal level at the K(r) of the electrode unit belonging to the r-th detection position group is regenerated. This allows the signal level of the r-th detection position group including the K(r) spatially dispersed detection positions to be regenerated in a short period of time between the cycles.

Preferably, the at least one processor calculate the proximity of an object, when executing the program, based on the signal level at the plurality of detection locations including the signal level of the N detection signals regenerated by the signal regeneration. When performing the position calculation, the at least one processor update the result of the calculation of the position based on the signal level at the plurality of detection positions including the signal level at the plurality of detection positions of the regenerated K(r) detection positions whenever the signal regeneration regenerates the signal level at the K(r) detection positions belonging to the r-th detection positions group. According to this structure, the calculation result of the position can be updated in a time shorter than the time of the one cycle.

Preferably, the at least one processor perform a neighborhood determination to determine whether an object is in proximity to the plurality of detection positions based on the composite detection signal periodically generated by repeating the detection process when the program is executed. When performing the sensor control, the at least one processor change the iterative period of the detection process in accordance with the determination result of the vicinity determination. According to this Structure, depending on whether or not the object is positioned in the vicinity of the plurality of detection positions, it is possible to change the repeated period of the detection process. For example, when the object is not located in the vicinity of the plurality of detection positions, the power consumption can be reduced by increasing the repetition period of the detection process.

Preferably, the at least one processor regenerate the calculated average of the two or greater signal levels as a signal level obtained for the overlapping detection position for the overlapping detection position belonging to two or greater of the detection positions based on an operation corresponding to multiplication of the inverse matrix and the composite detection signal matrix. According to this arrangement, the average of two or greater of the signal levels calculated for the overlap electrode unit is regenerated as the signal level at the overlap electrode unit, thereby reducing the effect of noise on the signal level.

Preferably, the N detection positions are aligned in one direction, and at least one of the detection positions at both ends of the array of N detection positions is the overlapping detection positions. According to this structure, among the N detection positions aligned in one direction, the electrode unit at the end is the overlapping detection position, thereby reducing the influence of noise that tends to act at the end.

Preferably, the sensor unit includes a plurality of detection elements disposed corresponding to the plurality of detection positions, the plurality of detection elements having a signal level corresponding to a proximity state of an object, wherein the polarity is set to be "1", "−1", or "0", respectively, in response to an input drive signal, a drive unit for supplying the drive signal to the plurality of detection elements according to the sensor control, and a composite detection signal generation unit for generating the composite detection signal corresponding to the sum of N detection signals generated by N detection elements corresponding to the N detection positions.

Preferably, the sensor unit includes at least one detection electrode and a plurality of drive electrodes intersecting the detection electrode. The detection element is formed at an intersection of the detection electrode and the drive electrode and is a capacitor whose capacitance varies with the proximity of an object. The drive unit supplies the drive signals to the plurality of drive electrodes, respectively. An N capacitor is formed between one of the detection electrodes and N of the drive electrodes as the N detection elements. The composite detection signal generation unit generates the composite detection signal based on the charge of the N capacitors transmitted to the detector electrode in response to the N drive signals supplied to the N drive electrodes.

BRIEF DESCRIPTION OF THE DRAWINGS

FIG. 3 is a diagram illustrating an example of a polarity pattern.

FIGS. 4A and 4B illustrate a partial polarity pattern included in a polarity pattern of FIG. 3.

FIGS. 5A and 5B are diagrams for explaining a relationship between the detection signal and the composite detection signal when the polarity pattern illustrated in FIG. 3 is used.

FIG. 5C illustrates an inverse of the polarity pattern matrix.

FIGS. 6A and 6B explain a method for calculating a signal level when the polarity pattern illustrated in FIG. 3 is used.

FIG. 7 illustrates a first modification of the polarity pattern.

FIGS. 8A and 8B illustrates a partial polarity pattern included in the polarity pattern of FIG. 7.

FIGS. 9A and 9B are diagrams explaining a relationship between the detection signal and the composite detection signal when the polarity pattern illustrated in FIG. 7 is used.

FIGS. 10A and 10B explain a calculation method of a signal level when a polarity pattern illustrated in FIG. 7 is used.

FIG. 11 is a diagram illustrating a second modified explanation of the polarity pattern.

FIGS. 12A and 12B illustrate a partial polarity pattern included in the partial polarity pattern of FIG. 11.

FIGS. 13A and 13B are diagrams illustrating the relationship between the detection signal and the composite detection signal when the polarity pattern illustrated in FIG. 11 is used.

FIGS. 14A and 14B are diagrams illustrating a method for calculating a signal level when the polarity pattern illustrated in FIG. 11 is used.

FIG. 15 is a diagram illustrating a third modified example of the polarity pattern.

FIGS. 17A and 17B are diagrams explaining the relationship between the detection signal and the composite detection signal when the polarity pattern illustrated in FIG. 15 is used.

FIGS. 18A and 18B are diagrams illustrating a method for calculating a signal level when the polarity pattern illustrated in FIG. 15 is used.

FIG. 19 is a diagram illustrating a fourth modified example of the polarity pattern.

FIGS. 20A and 20B illustrate the partial polarity pattern included in the polarity pattern of FIG. 19.

FIGS. 21A and 21B are diagrams illustrating a relationship between a detection signal and a composite detection signal when the polarity pattern illustrated in FIG. 19 is used.

FIGS. 22A to 22B are diagrams illustrating a method for calculating a signal level when the polarity pattern illustrated in FIG. 19 is used.

FIG. 23 is a diagram illustrating a fifth modified example of the polarity pattern.

FIGS. 24A to 24C are views illustrating a partial polarity pattern included in the polarity pattern of FIG. 23.

FIGS. 25A to 25C are diagrams illustrating a relationship between a detection signal and a composite detection signal when the polarity pattern illustrated in FIG. 23 is used.

FIGS. 26A and 26B illustrate inverse matrices of polarity pattern matrices.

FIGS. 27A to 27C are diagrams illustrating a method for calculating signal levels when the polarity pattern illustrated in FIG. 23 is used.

DESCRIPTION OF THE EMBODIMENTS

First Embodiment

Hereinafter, an input device according to the first embodiment will be described with reference to the drawings. The input device according to this embodiment is a device for inputting information according to the proximity state of an object at a plurality of detection positions and is applied to an input device such as a touch pad or a touch panel.

(Structure of Input Device)

Figure 1:
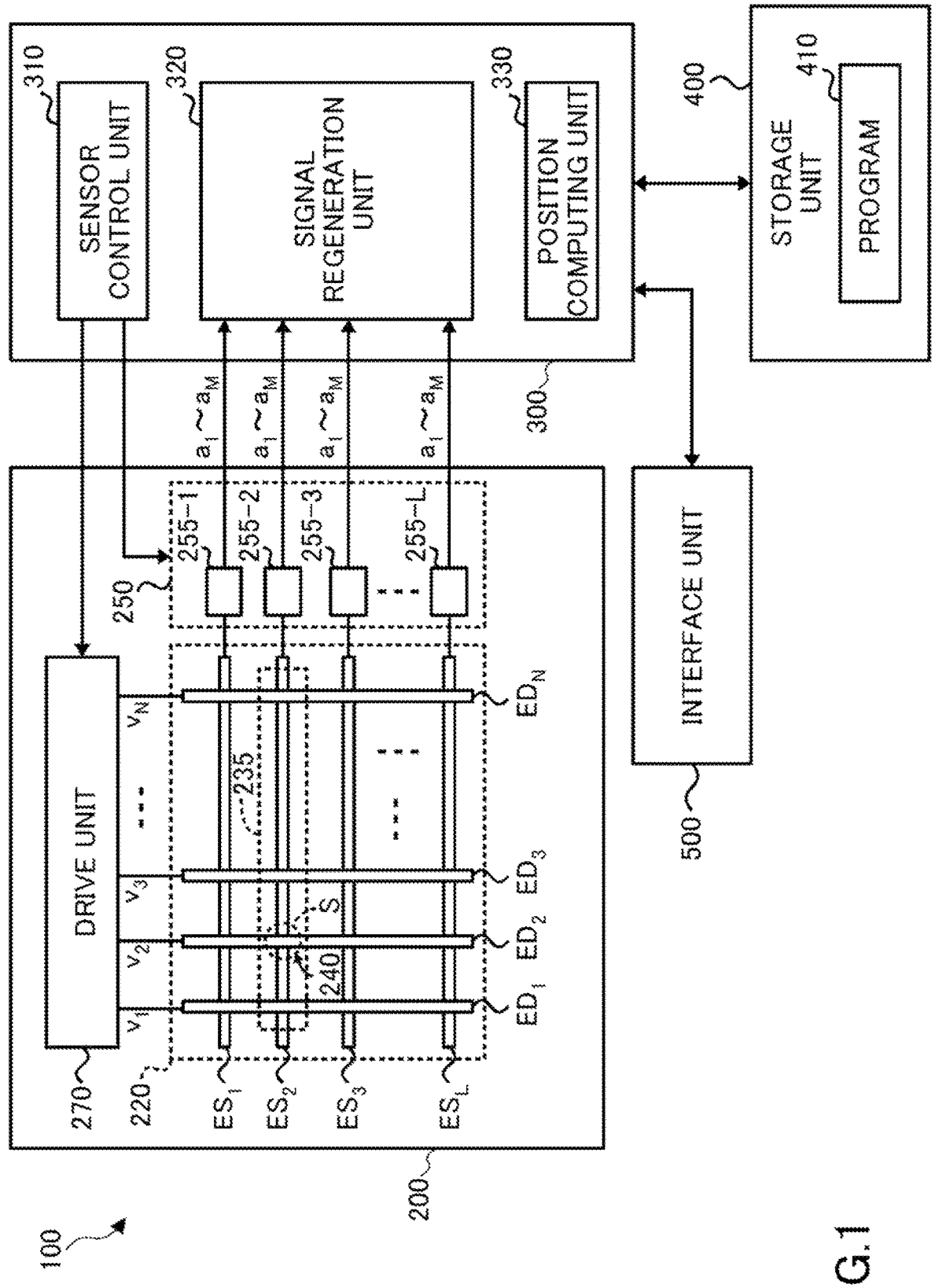
FIG. 1 is a diagram illustrating an example of the structure of an input device according to the present embodiment.

FIG. 1 is a diagram illustrating an example of the structure of the input device 100 according to the present embodiment. The input device 100 illustrated in FIG. 1 includes a sensor unit 200, a processing unit 300, a storage unit 400, and an interface unit 500. In this specification, the term "proximity" means being close to each other and does not limit the presence or absence of a contact.

The sensor unit 200 detects a proximity state of an object (such as a finger) at a plurality of detection positions S. The detection signal obtained as a result of detection of the proximity state of an object at each of the plurality of detection positions S has a signal level corresponding to the proximity state of the object and has a positive and negative polarities. The sensor unit 200 can control the polarity (positive or negative) of the detection signal obtained at each detection position S in accordance with the information of the polarity pattern P provided from the sensor control unit 310 of the processing unit 300, which will be described later.

The sensor unit 200 has L detection regions 235 including N detection positions S and has N×L detection positions S as a whole. The L detection regions 235 correspond to the L detection electrodes $ES_1$ to $ES_L$ described below. The sensor unit 200 generates one composite detection signal a for each of L detection regions 235. The composite detection signal a is a signal corresponding to the sum of the N detection signals obtained for the N detection positions S included in one detection region 235.

Hereinafter, the positive polarity set in the detection signal is represented by "1", the negative polarity set in the detection signal is represented by "−1", and the polarity set in the detection signal that is not added to the composite detection signal a is represented by "0". Further, when the sensor unit 200 generates one composite detection signal a, the N polarities set to the N detection signals are called the "polarity pattern P".

In the example of FIG. 1, the sensor unit 200 includes a plurality of detection elements 240 provided corresponding to the plurality of detection positions S, a drive unit 270 for supplying a drive signal v to each of the plurality of detection elements 240 in conformity with the control of the sensor control unit 310, and a composite detection signal generation unit 250 for generating a composite detection signal a for each detection region 235.

The plurality of detection elements 240 have a signal level corresponding to the proximity state of the object, such as a finger, and generate a detection signal whose polarity is set to "1", "−1", or "0", respectively, in response to the drive signal v supplied from the drive unit 270. The composite detection signal generation unit 250 generates a composite detection signal a corresponding to the sum of N detection signals generated by N detection elements 240 corresponding to the N detection positions S for each detection region 235.

In the example of FIG. 1, the sensor unit 200 includes an electrode unit 220 having a plurality of detection elements 240 formed therein. The electrode unit 220 includes L detection electrodes $ES_1$ to $ES_L$ (hereinafter, referred to as a detection electrode ES without discrimination) and N drive electrodes $ED_1$ to EDN (hereinafter, referred to as a drive electrode ED without discrimination). Each detection electrode ES intersects each of the N drive electrodes ED. At each intersection of the L detection electrodes ES and the N drive electrodes ED, a capacitor is formed in which the electrostatic capacitance varies in conformity with the proximity state of the object. In the example of FIG. 1, the position of the intersection between the detection electrode ES and the drive electrode ED is the detection position S at which the capacitor formed between the detection electrode ES and the drive electrode ED is the detection element 240.

For the sake of simplicity, in FIG. 1, only the detection position S and the detection element 240 are illustrated at the position where the detection electrode ES2 and the drive electrode ED2 intersect, but all the positions where the L detection electrode ES and the N drive electrode ED intersect are the detection positions S, and the detection element 240 as a capacitor is formed in each detection position S. Each detection element 240 generates a detection signal in which the signal level varies depending on the distance to an object such as a finger in the vicinity of the detection position S.

The detection signal generated in the detection element 240 is specifically electric charges stored in the capacitor as the detection element 240. Because a drive signal v having a predetermined voltage amplitude is applied by the drive unit 270 between one detection electrode ES and one drive electrode ED, the amount of charge (the signal level of the detection signal) charged and discharged in response to the drive signal v in the capacitor as the detection element 240 represents the capacitance of the capacitor. The polarity of the electric charges charged and discharged in the capacitor as the detection element 240 (the polarity of the detection signal) is controlled in accordance with the polarity of the voltage of the drive signal v supplied from the drive unit 270 to the drive electrode ED.

The above-described detection region 235 is an area including N detection positions S formed between one detection electrode ES and N drive electrodes ED. For the sake of simplicity, only the detection region 235 of the detection electrode ES2 is indicated by a dotted line in FIG. 1, but a similar detection region 235 is formed in the other detection electrode ES. In the example of FIG. 1, N detection positions S included in the detection regions 235 are aligned in one direction along the detection electrode ES.

The structure of the electrode unit 220 illustrated in FIG. 1 (the detection electrodes $ES_1$ to $ES_L$, and the drive electrodes $ED_1$ to $ED_N$) is an example, and the number, shape, and arrangement of the detection electrode ES and the drive electrode ED are not limited to those illustrated in this example. For example, in FIG. 1, the electrode unit 220 includes L detection electrodes ES, but the detection electrode ES may be only one. In addition, the number of detection positions S in each detection electrode ES may not be the same.

The drive unit 270 simultaneously supplies the drive signals v1 to vN to the drive electrodes $ED_1$ to $ED_N$ according to the control of the sensor control unit 310 of the processing unit 300. In FIG. 1, the number given to "v" indicates the index of the sign of the drive electrode ED to which the drive signal v is supplied.

The drive unit 270 sets the polarities of the N drive signals v1 to vN based on the information of the polarity pattern P input from the sensor control unit 310 of the processing unit 300. The polarity of the drive signal $v_j$ (j represents any integer from 1 to N) is specifically defined by the direction in which the relative voltage of the drive electrode $ED_j$ relative to the detection electrode ES varies at the timing of generating the composite detect signal a. For example, in the case of the polarity pattern P in which the polarity of the detection signal of the detection position S intersecting the drive electrode $ED_j$ is set to "1", the drive unit 270 supplies a drive signal $v_j$ that increases the relative voltage of the drive electrode $ED_j$ to the detection electrode ES at a timing when the composite detection signal a is generated. Conversely, in the case of the polarity pattern P where the polarity of the detection signal is set to "−1", the drive unit 270 supplies the drive signal $v_j$ that reduces the relative voltage of the drive electrode $ED_j$ relative to the detection electrode ES at the timing of generating the composite detection signal a. Accordingly, in the case where the polarity of the detection signal is set to "1" and the case where the polarity is set to "−1", the polarity of the charge stored in the detection element 240 (capacitor) (that is, the polarity of the detection signal) is reversed. On the other hand, in the case of the polarity pattern P in which the polarity of the detection signal is set to "0", the drive unit 270 maintains the relative voltage of the drive electrode $ED_j$ relative to the detection electrode ES at the timing when the composite detection signal a is generated. This causes the charge stored in the detection element 240 (capacitor) to be zero at the timing of generating the composite detection signal a.

The composite detection signal generation unit 250 generates a signal corresponding to the sum of N detection signals generated by N detection elements 240 included in one detection region 235 as one composite detection signal a. In the example of FIG. 1, the composite detection signal generation unit 250 includes L detection circuits 255-1 to 255-L (hereinafter, the detection circuit 255 may be referred to without discrimination) for generating the composite detection signal a. L detection circuits 255-1 to 255-L are connected to L detection electrodes $ES_1$ to $ES_L$ one-to-one. The numbers 1 through L attached to the detection circuit 255 indicate the index of the sign of the detection electrode ES to be connected.

The detection circuit 255 generates a composite detection signal a based on the electric charges of N capacitors (the detection elements 240) transmitted to the detection electrode ES in response to the N drive signals v supplied to the N drive electrodes ED. For example, the detection circuit 255 includes a charge lamp for outputting a composite detection signal in accordance with the sum of a charge (detection signal) transmitted from each detection element 240 (capacitor) through the detection electrode ES, and an AD converter for converting a composite detection signal output from the charge lamp into a digital signal and outputting it to the processing unit 300. The AD converter may be provided for each charge amp, or the output signal of the plurality of charge amps may be converted to a digital signal in a single AD converter. The detection circuit 255 may also be connected to one detection electrode ES, as illustrated in the example of FIG. 1, or it may be selectively connected to a plurality of detection electrodes ES by a multiplexer.

The processing unit 300 is a circuit for controlling the overall operation of the input device 100 and includes, for example, one or greater processors (CPU, MPU, or the like) that execute processing according to a command code of one or more programs 410 stored in the storage unit 400. The processing unit 300 operates as one or greater computers by executing one or greater programs 410 stored in the storage unit 400 by one or greater processors. The processing unit 300 may include one or greater dedicated hardware (such as an ASIC or an FPGA) configured to implement a specific function. In this case, the processing unit 300 may execute all of the processes related to the control of the input device 100 in one or greater computers described above, or at least a portion of the processes may be executed in dedicated hardware.

In the example of FIG. 1, the processing unit 300 includes a sensor control unit 310, a signal regeneration unit 320, and a position computing unit 330.

The sensor control unit 310 controls the sensor unit 200 so as to generate the composite detection signals a of M units (where M is an integer equal to or greater than N) in each detection region 235. That is, the sensor control unit 310 generates the at least N composite detection signals a that are as many as the sum of N detection signals. The sensor control unit 310 produces M composite detection signals (MN) and causes the polarity pattern P of each composite detection signal a to differ from one another. That is, all of the M polarity patterns P used to generate the M composite detection signals a are different.

The signal regeneration unit 320 regenerates the signal levels of the N detection signals obtained at the N detection positions S for each of the L detection regions 235 based on the M composite detection signals a generated by the sensor unit 200.

In this embodiment, each of the N detection positions S belongs to a portion of a r-th detection position group G. In addition, two or greater detection positions S belong to each of the r-th detection position groups G. Here, the number of detection positions S belonging to one detection position group G is set to "K" (K≥2). The number of detection positions S may be different for each detection position group G. The K polarities set for the K detection positions S belonging to one detection position group G is called a partial polarity pattern PB.

Each of M polarity patterns P used to generate the M composite detection signals a includes one partial polarity pattern PB and all polarities other than the one partial polarity pattern PB that are "0". Therefore, M polarity patterns P correspond to M partial polarity patterns PB one-to-one. Then, one composite detection signal a generated by one polarity pattern P substantially represents the sum of K detection signals obtained for K detection positions S belonging to one detection position group G. In other words, each of M composite detection signals a represents the sum of K detection signals corresponding to any one of r-th detection position groups G.

The sum of the K detection signals obtained for K detection positions S belonging to one detection position group G can be calculated by a linear Formula defined by K polarities (partial polarity pattern PB) set for K detection positions S. In order to obtain the value (signal level) of the K detection signals, a simultaneous formula including the K linear Formulas may be solved. That is, the value (signal level) of the K detection signals can be obtained by solving the above-described simultaneous cubic formula based on K different partial polarity patterns PB for setting the polarity of one detection position group G and K composite detection signals a generated by K polarity patterns P corresponding to K partial polarity patterns PB. In order to provide a simultaneous formula including K linear formulas, K composite detection signals a are generated by K different polarity patterns P for one detection position group G. In other words, one detection position group G is supported by K composite detection signals a, and this K composite detection signal a is used to solve the aforementioned simultaneous formula.

A 1-row K-columns matrix including K elements that have a value of "1", "−1", or "0" and representing one partial polarity pattern PB is called a partial matrix B. A K-rows K-columns matrix including K different submatrices B corresponding to K different partial polarity patterns PB is called a polarity pattern matrix D. Further, a K-rows 1-column matrix in which K composite detection signals a are the elements generated by K polarity patterns P corresponding to K different partial polarity patterns PR is called a composite detection signal matrix A. The operation for solving the simultaneous formula of K linear formulas described above is an operation equivalent to the multiplication of an inverse matrix $D^{-1}$ and the composite detection signal matrix A for the polarity pattern matrix D.

The signal regeneration unit 320 regenerates the signal level of the K detection signals obtained for the K detected positions S belonging to one detection position group G based on an operation corresponding to the multiplication of the reverse matrix $D^{-1}$ and the composite detection signal matrix A. The polarity pattern matrix D (inverse matrix $D^{-1}$) can be independently selected for each detection position group G. That is, the selection of the polarity pattern matrix D in one detection position group G does not affect the selection of the polarity pattern matrix D in another detection position group G. As described above, because the polarity pattern matrix D can be independently selected for each of the r-th detection position groups G, the freedom of selection of the polarity pattern matrix D is high.

The signal regeneration unit 320 may regenerate the signal level of the detection signal by processing directly using the polarity pattern matrix D (inverse matrix $D^{-1}$), and may regenerate the signal level of the detection signal by another processing that is derived from processing directly using the polarity pattern matrix D (inverse matrix $D^{-1}$).

The position computing unit 330 calculates a position (the coordinates on an operating surface, etc.) at which the object (such as a finger) is proximate based on the signal level of the detection signal in L detection regions 235 (N×L detection positions S) regenerated by the signal regeneration unit 320. For example, the position computing unit 330 binary two-dimensional data represented by the detection signal of each detection position S to specify a region in which data representing the proximity of the object is collected as the proximate region individually of the object. The position computing unit 330 computes the coordinates of the object having L detection regions 235 on an operating surface from the distribution of the detection signal within a region proximate to the specified object.

The storage unit 400 is a memory for storing the instruction code of the program 410 executed by the computer included in the processing unit 300, variable data temporarily stored in the processing process of the processing unit 300 (such as the composite detection signal a generated in the composite detection signal generation unit 250), and constant data used for processing of the processing unit 300 (such as the polarity pattern P supplied to the drive unit 270, the reverse matrix $D^{-1}$ used for regenerating the detection signal). The storage unit 400 includes one or greater kinds of storage devices, for example, ROM, RAM, flash memory, or the like.

The interface unit 500 is a circuit for exchanging data between the input device 100 and another device (such as a control IC of an electronic apparatus in which the input device 100 is installed). The processing unit 300 outputs information stored in the storage unit 400 (coordinate information in which an object is proximate, the number of proximate objects, or the like) from the interface unit 500 to the control device (not illustrated). The interface unit 500 may read out the program 410 executed in the computer of the processing unit 300 from a non-transitory tangible recording medium such as a memory card or a USB memory and store it in the storage unit 400, or it may download it from a server on the network and store it in the storage unit 400.

(Operation)

Next, an operation related to the generation of the composite detection signal a and the regeneration of the signal level of the detection signal in the input device 100 according to the present embodiment will be described with reference to the flowchart illustrated in FIG. 2.

Here, terms are defined as follows. The M composite detection signals a generated by the sensor unit 200 according to the control of the sensor control unit 310 are represented by the symbols "$a_1$", "$a_2$", " . . . ", and "$a_M$", respectively. The suffix "a" indicates the order in which M composite detection signals a are generated. M polarity patterns P set to generate M composite detection signals $a_1$, $a_2$, . . . , $a_M$ are represented by the symbols "$P_1$", "$P_2$", . . . , and "$P_M$", respectively. When generating the composite detection signal $a_i$, the sensor control unit 310 controls the sensor unit 200 so as to set the polarity pattern $P_i$ with respect to the N detection signals of the detection positions S. Here, i is an integer from 1 to M.

N detection positions S included in one detection region 235 are represented by the symbols "$S_1$", "$S_2$", "$S_N$", respectively. The suffix of "S" indicates the order (sequential order) in the array of N detection positions S aligned in one direction in the detection region 235. The signal levels of N detection signals obtained by detection positions $S_1$, $S_2$, . . . , $S_N$ are represented by the symbols "$c_1$", "$c_2$", " . . . ", and "$c_N$", respectively. The detection signal obtained at the detection position $S_j$ has a signal level $c_j$. Further, j represents an integer from 1 to N.

When each of the r-th detection position groups G is distinguished, it is called the 1st detection position group $G_1$ to the r-th detection position group $G_R$. The number of detection positions S belonging to the r-th detection position group $G_r$ is set to "K(r)". Where r is an integer from 1 to R, and K(r) is an integer greater than or equal to 2.

K(r) polarities set in the K(r) detection signal obtained for the K(r) detection positions S belonging to the r-th detection position group $G_r$ is called a r-th partial polarity pattern $PB^{(r)}$. A r-th partial polarity pattern $PB^{(r)}$ is the partial polarity pattern PB determined for the r-th detection position group $G_r$ among the M-th partial polarity pattern PB corresponding to the M polarity patterns P.

The r-th partial polarity pattern $PB^{(r)}$ included in the polarity pattern $P_i$ is represented by "$PB_i^{(r)}$".

K(r) composite detection signals a corresponding to the r-th detection position group $G_r$ are represented by "$a_{q[r,\ 1]}$", "$a_{q[r,\ 2]}$", . . . , and "$a_{q[r,\ K(r)]}$", respectively. The suffixes q[r, 1], q[r, 2], . . . , and q[r, K(r)] of "a" indicate integers from 1 to M, respectively. K(r) polarity patterns P, which are set to generate the composite detection signal $a_{q[r,1]}$, $a_{q[r,\ 2]}$, . . . , and $a_{q[r,\ K(r)]}$, are represented by "$P_{q[r,\ 1]}$", "$P_{q[r,\ 2]}$", and "$P_{q[r,\ K(r)]}$" respectively. The polarity patterns $P_{q[r,\ 1]}$, $P_{q[r,\ 2]}$, . . . , $P_{q[r,\ K(r)]}$ include the r-th partial polarity pattern $PB_{q[r,\ 1]}^{(r)}$, $PB_{q[r,\ 2]}^{(r)}$, . . . , and $PB_{q[r,\ K(r)]}^{(r)}$, respectively.

K(r) detection positions S belonging to the r-th detection position group $G_r$ are represented by "$S_{p[r,\ 1]}$", "$S_{p[r,\ 2]}$", "$S_{p[r,\ K(r)]}$", respectively. The suffixes p[r, 1], p[r, 2], . . . , p[r, K(r)] of "S" indicate integers from 1 to N, respectively. The signal levels of the detection signals obtained at the detection positions $S_{p[r,\ 1]}$, $S_{p[r,\ 2]}$, . . . , and $S_{p[r,\ K(r)]}$ are represented by $c_{p[r,\ 1]}$, $c_{p[r,\ 2]}$, and $c_{p[r,\ K(r)]}$, respectively.

The signal level of the detection signal obtained at the K(r) detection positions $S_{p[r,\ 1]}$, $S_{p[r,\ 2]}$, . . . , $S_{p[r,\ K(r)]}$ belonging to the r-th detection position group Gr is represented by the K(r)-rows 1-column r-th signal level matrix $C_r$, as indicated by Formula 1.

[Formula 1]

$$C_r = \begin{pmatrix} c_{p[r,1]} \\ c_{p[r,2]} \\ \vdots \\ c_{p[r,K(r)]} \end{pmatrix} \quad (1)$$

A r-th signal level matrix $C_r$ includes K(r) signal levels $c_{p[r,\ 1]}$, $c_{p[r,\ 2]}$, . . . , and $c_{p[r,\ K(r)]}$.

K(r) composite detection signals $a_{q[r,\ 1]}$, $a_{q[r,\ 2]}$, . . . , $a_{q[r,\ K(r)]}$ corresponding to the r-th detection position group $G_r$ are represented by the r-th composite detection signal matrix $A_r$ in the first column of K(r), as indicated by Formula 2.

[Formula 2]

$$A_r = \begin{pmatrix} a_{q[r,1]} \\ a_{q[r,2]} \\ \vdots \\ a_{q[r,K(r)]} \end{pmatrix} \quad (2)$$

The number of elements K(r) of the r-th composite detection signal matrix $A_r$ is equal to the number of elements K(r) of the r-th signal level matrix $C_r$. The sensor control unit 310 controls the sensor unit 200 to generate a composite detection signal a having the same number as the detection position S belonging to the r-th detection position group $G_r$ using the polarity patterns P having the same number as the detection position S belonging to the r-th detection position group $G_r$.

The polarities to be set by the r-th partial polarity pattern $PB_{q[r,\ t]}^{(r)}$ for the $K^{(r)}$ detection signals are "$d_{p[r,1]q[r,t]}$", "$d_{p[r,2]q[r,t]}$", . . . , "$dp_{[r,K(r)]q[r,t]}$", respectively. In this case, the r-th partial polarity pattern $PB_{q[r,\ t]}^{(r)}$ is represented by the r-1-rows K(r)-columns partial matrix $B_{q[r,t]}^{(r)}$ as illustrated in Formula 3. Here, t is an integer from 1 to K(r).

[Formula 3]

$$B_{q[r,t]}^{(r)} = (d_{p[r,1]q[r,t]} d_{p[r,2]q[r,t]} \cdots d_{p[r,K(r)]q[r,t]}) \quad (3)$$

Polarities $d_{p[r,1]q[r,t]}$, $d_{p[r,2]q[r,t]}$, . . . , $dp_{[r,K(r)]q[r,t]}$ are polarities set for a detection signals respectively obtained at detection positions $S_{p[r,1]}$, $S_{p[r,2]}$, . . . , $Sp_{[r,K(r)]}$ and have the value of "1", "−1", or "0".

The r-th polarity pattern matrix $D_r$, which represents the conversion of the r-th signal level matrix Cr to the r-th composite detection signal matrix Ar, is a K(r)-rows K(r)-columns matrix, including K (r) submatrices $B_{q[r,\ 1]}^{(r)}$, $B_{q[r,\ 2]}^{(r)}$, . . . , $B_{q[r,\ K(r)]}^{(r)}$, and is represented by the following Formula 4.

[Formula 4]

$$D_r = \begin{pmatrix} B_{q[r,1]}^{(r)} \\ \vdots \\ B_{q[r,K(r)]}^{(r)} \end{pmatrix} = \begin{pmatrix} d_{p[r,1]q[r,1]} & \cdots & d_{p[r,K(r)]q[r,1]} \\ \vdots & \ddots & \vdots \\ d_{p[r,1]q[r,K(r)]} & \cdots & d_{p[r,K(r)]q[r,K(r)]} \end{pmatrix} \quad (4)$$

Hereinafter, the K(r) r-th submatrices $B_{q[r,1]}^{(r)}$, $B_{q[r,2]}^{(r)}$, . . . , $Bq_{[r,K(r)]}^{(r)}$ may be designated as "r-th partial matrix B(r)".

Each row in the r-th polarity pattern matrix Dr represents one of K(r) r-th partial polarity patterns $PB_{q[r,\ 1]}(r)$, $PB_{q[r,\ 2]}(r)$, . . . , and $PB_{q[r,\ K(r)]}(r)$. the differently, the polarity of K(r) belonging to one row represents a group of polarities set for the detection signals of the K(r) detection positions S of the r-th detection position group $G_r$ in order to generate one composite detection signal a.

Each column in the r-th polarity pattern matrix $D_r$ corresponds to one of the K(r) detection positions S belonging to the r-th detection position group $G_r$. In the example of FIG. 1, each column corresponds to one of the K(r) drive electrodes ED. The element belonging to the one column of the polarity pattern matrix D represents the polarity set for the detection signal of the one detection position S corresponding to the one column, and in the example of FIG. 1, the polarity set for the drive signal v of one drive electrode ED corresponding to the one column.

Using this r-th polarity pattern matrix $D_r$, the relationship between the r-th signal level matrix Cr and the r-th composite detection signal matrix Ar is expressed as Formula 5.

[Formula 5]

$$A_r = D_r \times C_r \quad (5)$$

If Formula 5 is expressed using components, it becomes like Formula 6.

[Formula 6]

$$\begin{pmatrix} a_{q[r,1]} \\ a_{q[r,2]} \\ \vdots \\ a_{q[r,K(r)]} \end{pmatrix} = \begin{pmatrix} c_{p[r,1]} d_{p[r,1]q[r,1]} + c_{p[r,2]} d_{p[r,2]q[r,1]} + \cdots + c_{p[r,K(r)]} d_{p[r,K(r)]q[r,1]} \\ c_{p[r,1]} d_{p[r,1]q[r,2]} + c_{p[r,2]} d_{p[r,2]q[r,2]} + \cdots + c_{p[r,K(r)]} d_{p[r,K(r)]q[r,2]} \\ \vdots \\ c_{p[r,1]} d_{p[r,1]q[r,K(r)]} + c_{p[r,2]} d_{p[r,2]q[r,K(r)]} + \cdots + c_{p[r,K(r)]} d_{p[r,K(r)]q[r,K(r)]} \end{pmatrix} \quad (6)$$

The individual terms in the polynomial on the right-hand side of Formula 6 represent the signal level of the detection signal at each detection position S. When the polarity $d_{p[r,s]q[r,t]}$ (s, t denotes integers from 1 to K(r)) is "1" or "−1", the absolute value of the polarity $d_{p[r,s]q[r,t]}$ is 1, so the absolute value of the polarity $d_{p[r,s]q[r,t]}$ multiplied by the signal level $c_{p[r,s]}$ is equal to the signal level $c_{p[r,s]}$. As long as the proximity state of the object is constant, it is assumed that the signal level $c_{p[r,s]}$ does not change even when polarity is reversed by the control of the sensor unit 200 (even when polarity $d_{p[r,s]q[r,t]}$ is changed between "1" and "−1").

On the other hand, when the polarity $d_{p[r,s]q[r,t]}$ is set to "0", the value obtained by multiplying the polarity $d_{p[r,s]q[r,t]}$ by the signal level $c_{p[r,s]}$ is zero. Said differently, it is assumed that the detection signal whose polarity $d_{p[r,s]q[r,t]}$ is set to "0" is not added to the composite detection signal $a_{q[r,t]}$ regardless of any proximity state of the object at the detection position S where the detection signal is obtained (regardless of the value of the signal level $c_{p[r,s]}$).

As the r-th polarity pattern matrix $D_r$, a matrix in which the difference between the number of elements of "1" and the number of elements of "−1" in the partial polarity pattern PB of each row (r-th partial matrix $B^{(r)}$) is small can be selected. Therefore, the polarity of the drive signal v output from the drive unit 270 (the change direction of the voltage of the drive electrode ED relative to the detection electrode ES) can be reduced, and the radiation noise emitted from the N drive electrodes ED upon supply of the drive signal v can be suppressed.

In addition, by reducing the difference between the number of elements of "1" and the number of elements of "−1" included in the partial polarity pattern PB (r-partial matrix B(r)) of each row, polarity deviation is reduced in the K(r) detection signals that are the source of the composite detection signals a. Therefore, the amplitude of the composite detection signal a is more likely to be suppressed than a case where the K(r) detection signals a include only the detection signal of "1" or the detection signal of "−1". Therefore, the sensitivity (gain) is easily increased in each detection circuit 255 of the composite detection signal generation unit 250 in which the composite detection signal a is input, and a minute detection signal obtained in each detection element 240 is easily regenerated with a high sensitivity.

Figure 2:
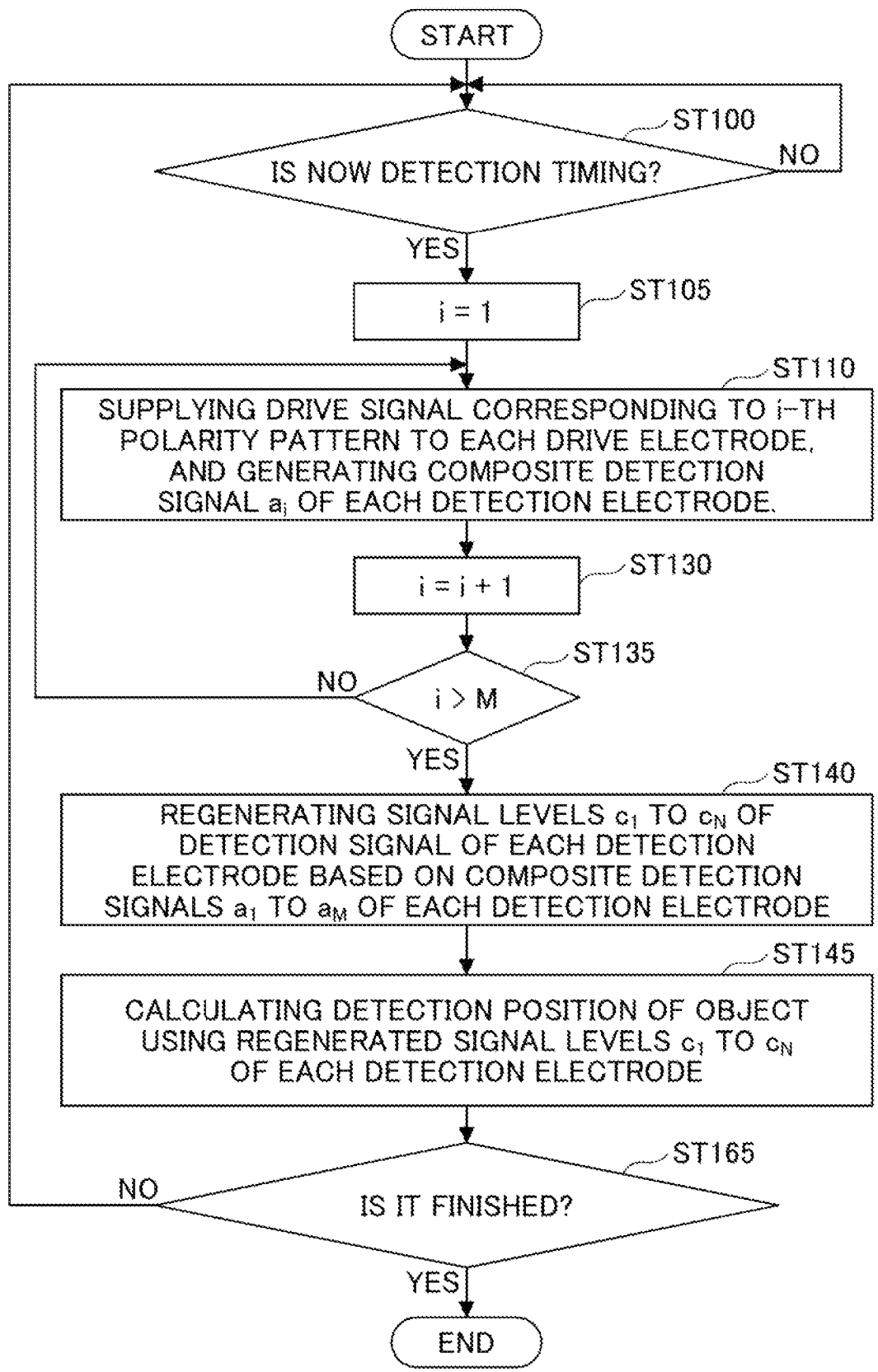
FIG. 2 is a flowchart illustrating an operation related to the generation of a composite detection signal and the regeneration of a detection signal level in the first embodiment.

Referring to a flowchart illustrated in FIG. 2, the sensor control unit 310 determines whether a periodic detection timing for generating the composite detection signal a of the detection signals of each detection position S has arrived (ST 100). When it is determined that the periodic detection timing has arrived (YES of ST100), the sensor control unit 310 controls the sensor unit 200 in steps ST105 to ST135 to generate M composite detection signals $a_1$ to $a_M$ corresponding to different M polarity patterns $P_1$ to $P_M$.

At first, the sensor control unit 310 controls the drive unit 270 so that an initial value of 1 (ST105) is set to a variable i (ST105) and the driving signals v1 to vN set to be polarity by the polarity pattern $P_i$ are supplied to the drive electrodes ED1 to EDN. The sensor control unit 310 controls each detection circuit 255 of the composite detection signal generation unit 250 so as to generate the composite detection signal $a_i$ of each detection electrode ES in accordance with the timing of the supplying the drive signals v1 to vN (ST110).

Next, the sensor control unit 310 increments the variable i by 1 (ST130) and repeats the processing of steps ST105 and later when the variable i is M or less (NO of ST135). Accordingly, the sensor control unit 310 repeats the process of the step ST110 until the M composite detection signals $a_1$ to $a_M$ are generated.

When the variable i is greater than M (YES in ST135), the process proceeds to ST140. The signal regeneration unit 320 regenerates the signal levels $c_1$ to $c_N$ of the detection signal of each detection electrode ES based on the M composite detection signals $a_1$ to $a_M$ generated for each detection electrode ES (ST140).

As illustrated in Formula 5, the r-th composite detection signal matrix $A_r$ is expressed as the product of the r-th polarity pattern matrix $D_r$ and the r-th signal level matrix $C_r$. Therefore, the r-th signal level matrix $C_r$ is represented by the product of the inverse matrix of the r-th polarity pattern matrix $D_r$ and the r-th composite detection signal matrix $A_r$, as illustrated in Formula 7-1 below. The position computing unit 330 computes the position of an object proximate to the L detection regions 235 based on the signal levels of the L detection regions 235 (N×L detection positions S) regenerated by the signal regeneration unit 320 (ST145). When the detection process is continued (YES of ST165), the processing unit 300 returns to the step ST100 and repeats the above-described processing.

[Formula 7]

$$C_r = D_r^{-1} \times A_r \quad (7\text{-}1)$$

$$\alpha \cdot C_r = \alpha \cdot D_r^{-1} \times A_r \quad (7\text{-}2)$$

However, the inverse matrix of the r-th polarity pattern matrix $D_r^{-1}$ may include an element that is not an integer. In this case, as illustrated in Formula 7-2, the signal regeneration unit 320 may calculate the product of the inverse matrix $\alpha \cdot D_r^{-1}$ multiplied by an appropriate coefficient $\alpha$ to convert each element to an integer (e.g., 1) and the r-th composite detection signal matrix Ar. By using the integer inverse matrix $\alpha \cdot D_r^{-1}$ in each element, burden associated with matrix multiplication can be relaxed.

Next, an example of the polarity pattern P used to generate the composite detection signal a will be described.

Figure 3:
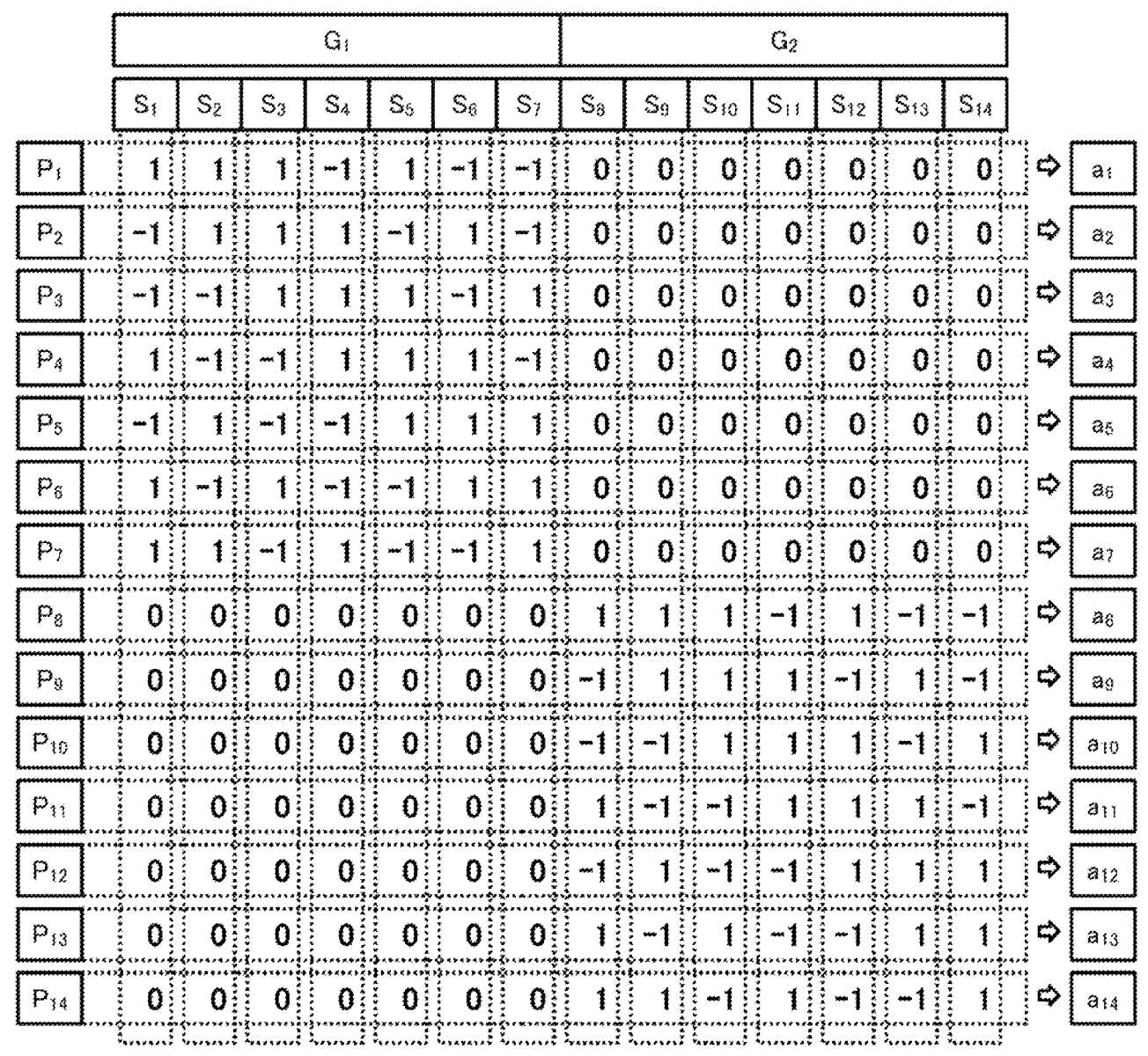

FIG. 3 is a diagram showing an example of the polarity pattern P. In the example of FIG. 3, the number of detection positions S is 14 (N=14), and the number of composite detection signals a generated by the sensor unit 200 to regenerate the signal level at each detection position S is also 14 (M=14). Seven detection positions S1 to S7 belong to the 1st detection position group $G_1$ (K(1)=7), and seven detection positions S8 to S14 also belong to the 2nd detection position group $G_2$ (K(2)=7). 7 (K(1)) composite detection signals $a_1$ to $a_7$ correspond to the 1st detection position group $G_1$, and 7 (K(2)) composite detection signals $a_a$ to $a_{14}$ correspond to the 2nd detection position group $G_2$.

FIGS. 4A and 4B illustrate the partial polarity pattern PB included in the polarity pattern P illustrated in FIG. 3. FIG. 4A illustrates seven 1st partial polarity patterns $PB_1^{(1)}$ to $PB_7^{(1)}$ used to generate seven composite detection signals $a_1$ to $a_7$ corresponding to the 1st detection position group $G_1$. FIG. 4B illustrates seven 2nd partial polarity patterns $PB_8^{(2)}$ to $PB_{14}^{(2)}$ used to generate seven composite detection signals $a_8$ to $a_{14}$ corresponding to 2nd detection position group $G_2$.

FIGS. 5A and 5B are diagrams explaining the relationship between the detection signal of each detection position group G and the composite detection signal a using the polarity pattern P illustrated in FIG. 3, and represent the matrix equation corresponding to Formula 5. FIG. 5A illustrates that the product of the 1st polarity pattern matrix $D_1$ and the 1st signal level matrix $C_1$ is equal to the 1st composite detection signal matrix A1. FIG. 5B illustrates that the product of the 2nd polarity pattern matrix $D_2$ and the 2nd signal level matrix $C_2$ is equal to the 2nd composite detection signal matrix $A_2$. As illustrated in FIG. 5A, the 1st polarity pattern matrix $D_1$ includes seven 1st partial matrices $B_1^{(1)}$ to $B_2^{(1)}$. As illustrated in FIG. 5B, the 2nd polarity pattern matrix $D_2$ includes seven 2nd partial matrices $B_0^{(2)}$ to $B_{14}^{(2)}$. As can be known from the comparison between FIGS. 5A and 5B, the 1st polarity pattern matrix $D_1$ and the 2nd polarity pattern matrix $D_2$ are equal.

FIG. 5C is a diagram illustrating the inverse matrices $D_1^{-1}$ and $D_2^{-1}$ of the 1st polarity pattern matrix $D_1$ and the 2nd polarity pattern matrix $D_2$. As illustrated in FIG. 5C, each element of the inverse matrix $D_1^{-1}$, $D_2^{-1}$ is "0" or "0.25", and all elements can be "0" or "1" by multiplying all elements by fourfold.

FIGS. 6A and 6B are diagrams illustrating a method for calculating the signal level of the detection signal using the polarity pattern P illustrated in FIG. 3, and represent the matrix equation corresponding to Formula 7-2. FIG. 6A illustrates that the product of the 1st composite detection signal matrix $A_1$ and the inverse matrix $4 \cdot D_1^{-1}$ is equal to the product of the respective elements of the 1st signal level matrix $C_1$ multiplied by 4, and FIG. 6B illustrates that the product of the 2nd composite detection signal matrix A2 and the inverse matrix $4 \cdot D_2^{-1}$ is equal to the product of the respective elements of the 2nd signal level matrix $C_2$ multiplied by 4. Because each element of the inverse matrix ($4 \cdot D_1^{-1}$, inverse matrix $4 \cdot D_2^{-1}$) is "1" or "0", the matrix product illustrated in FIGS. 6A and 6C is a simple operation to add some elements of the composite detection signal matrix A ($A_1$, $A_2$).

As described above, according to the present embodiment, the r-th detection position group $G_r$ corresponds the K(r) composite detection signals a having the same number of detection positions S included in the r-th detection position group $G_r$. Each of the K(r) polarity patterns P used to generate the K(r) composite detection signal a includes one r-th partial polarity pattern $PB^{(r)}$, and all polarities other than the one r-th partial polarity pattern $PB^{(r)}$ are "0". For this reason, each of the K(r) composite detection signals a corresponding to the r-th detection position group $G_r$ becomes K(r) detection signals obtained for the K(r) detection positions S belonging to the r-th detection position group $G_r$ and a signal generated based on the r-th partial polarity pattern PBW, and is generated independently of the partial polarity pattern PB other than the r-th partial polarity pattern PB(r). The signal levels of the K(r) detection signals obtained for the K(r) detection positions S belonging to the r-th detection position group $G_r$ is regenerated based on an operation equivalent to the multiplication of the inverse matrix $D_r^{-1}$ of the r-th polarity pattern matrix $D_r$ configured by the r-th partial matrix $B^{(r)}$ representing the r-th partial pattern $PB^{(r)}$ with the composite detection signal matrix A having the K(r) composite detection signals as elements. Therefore, for the r-th detection position groups G, it is possible to independently use the polarity pattern matrix D (a 1st polarity pattern matrix $D_1$ to a R-th polarity pattern matrix $D_R$) respectively, thereby increasing the degree of freedom of selection of the polarity pattern matrix D.

Because the degree of freedom in selecting the polarity pattern matrix D is high, it becomes easier to select a matrix in which the difference between the number of elements of "1" and the number of elements of "−1" is small in the partial polarity pattern PB (partial matrix B) of each row of the polarity pattern matrix D, thereby reducing a radiation noise and suppressing the amplitude of the composite detection signal a. In addition, because the degree of freedom in selecting the polarity pattern matrix D is high, it is easier to select the polarity pattern matrix D, in which the multiplication of the inverse matrix $D_r^{-1}$ and the composite detection signal matrix A is simplified, thereby reducing the load on the matrix operation.

Next, some variations of the polarity pattern P used in this embodiment will be described.

(First Modification of Polarity Pattern P)

Figure 7:
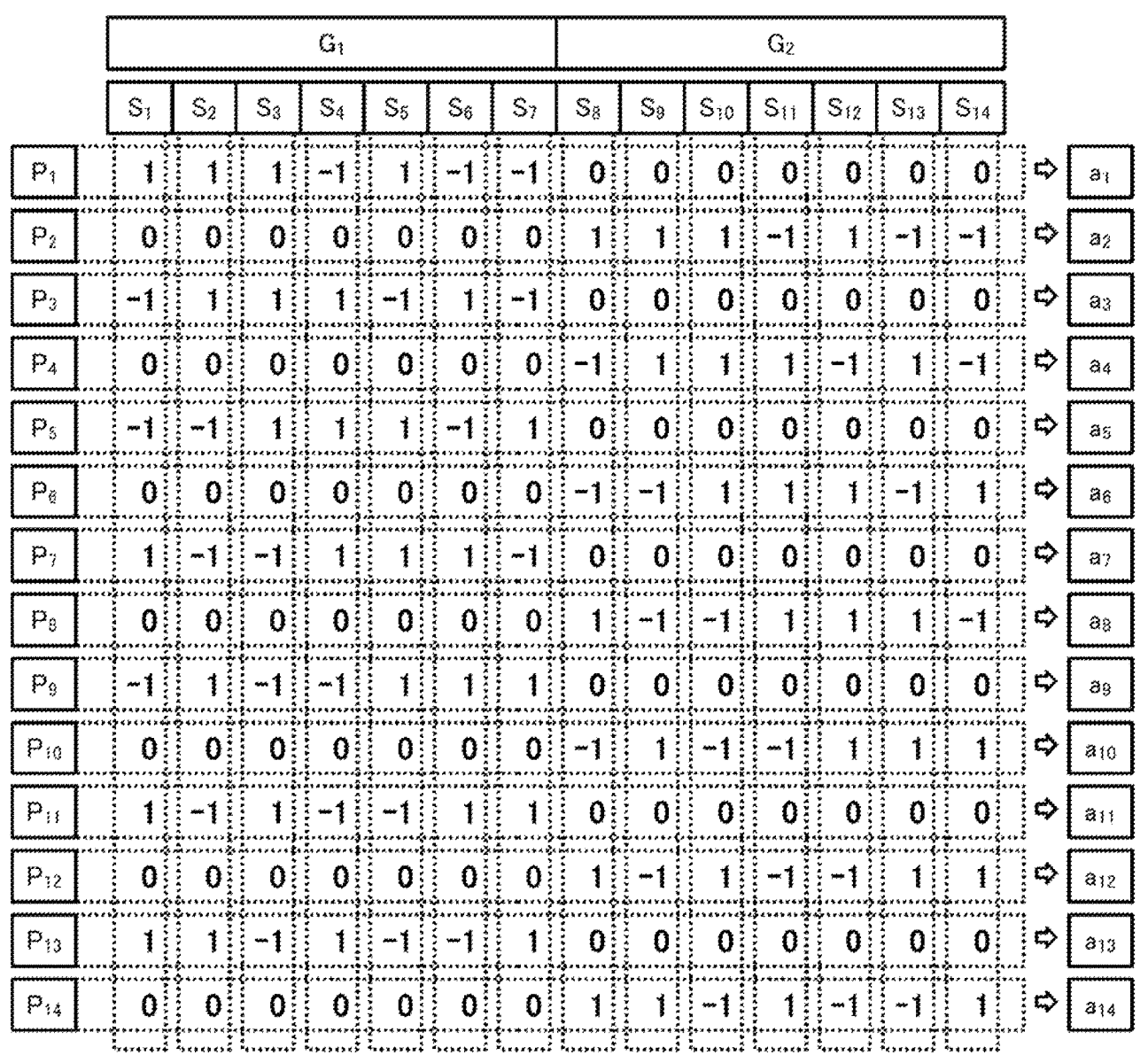

FIG. 7 is a diagram illustrating a first modification of the polarity pattern P. The polarity pattern P illustrated in FIG. 7 differs from the polarity pattern P illustrated in FIG. 3 in that of the 14 composite detection signals $a_1$ to $a_{14}$, seven composite detection signals $a_1$, $a_3$, . . . , $a_{13}$ each having a suffix of an odd number correspond to the 1st detection position group1 $G_1$, and the seven composite detection signals $a_2, a_4, \ldots, a_{14}$ having a suffix of an even number correspond to the 2nd detection position group $G_2$.

FIGS. 8A and 8B illustrate the partial polarity pattern PB included in the polarity pattern P of FIG. 7. FIG. 8A illustrates seven 1st partial polarity patterns $PB_1^{(1)}$, $PB_3^{(1)}, \ldots$, and $PB_{13}^{(1)}$ that are used to generate the seven composite detection signals $a_1, a_3, \ldots$, and $a_{13}$ corresponding to the 1st detection position group $G_1$. FIG. 8B illustrates seven 2nd partial polarity patterns $PB_2^{(2)}, PB_4^{(2)}, \ldots$, and $PB_{14}^{(2)}$ that are used to generate seven composite detection signals $a_2, a_4, \ldots$, and $a_{14}$ corresponding to the 2nd detection position group $G_2$.

FIGS. 9A and 9B are diagrams for explaining the relationship between the detection signal of each detection position group G and the composite detection signal a in a case where the polarity pattern P illustrated in FIG. 7 is used, and represent a matrix corresponding to Formula 5. FIG. 9A illustrates that the product of the 1st polarity pattern matrix $D_1$ and the 1st signal level matrix $C_1$ is equal to the 1st composite detection signal matrix $A_1$, and FIG. 9B illustrates that the product of the 2nd polarity pattern matrix $D_2$ and the 2nd signal level matrix $C_2$ is equal to the 2nd composite detection signal matrix $A_2$. The elements of the composite detection signal matrices $A_1$ and $A_2$ illustrated in FIGS. 9A and 9B are partially replaced by the elements of the composite detection signal matrices $A_1$ and $A_2$ illustrated in FIGS. 5A and 5B.

FIGS. 10A and 10B are diagrams illustrating a method for calculating the signal level of the detection signal using the polarity pattern P illustrated in FIG. 7, and represent a matrix determinant corresponding to Formula 7-2. FIG. 10A illustrates that the product of the 1st composite detection signal matrix A1 and the inverse detection signal matrix $4 \cdot D_1^{-1}$ is equal to every element of the 1st signal level matrix $C_1$ multiplied by 4, and FIG. 10B illustrates that the product of the 2nd composite detection signal matrix $A_2$ and the inverse detection signal matrix $4 \cdot D_2^{-1}$ is equal to every element of the 2nd signal level matrix $C_2$ multiplied by 4. The inverse matrix ($D_1^{-1}$, inverse matrix $D_2^{-1}$) in this embodiment is the same as that in FIG. 5C. The elements of the composite detection signal matrices $A_1$ and $A_2$ illustrated in FIGS. 10A and 10B are those partially replacing the elements of the composite detection signal matrices $A_1$ and $A_2$ illustrated in FIGS. 6A and 6B.

As described above, the sensor control unit 310 may control the sensor unit 200 so as to generate two composite detection signals a corresponding to different detection position groups G ($G_1$ and $G_2$) forth and back continuously in a case of sequentially generating 14 composite detection signals $a_1$ to $a_{14}$. For example, the sensor control unit 310 may alternately generate the composite detection signal a corresponding to the 1st detection position group $G_1$ and the composite detection signal a corresponding to the 2nd detection position group $G_2$, as illustrated in FIG. 7. Even in a case where noise occurs with concentration in a part of time range by dispersing the timing of the generation of the composite detection signal a in time in each detection position group G (for example, a case in which intermittent noise is generated by a radio communication method such as GSM ("GSM" is a registered trademark), the influence of noise on the signal level regenerated by the signal regeneration unit 320 can be dispersed in a plurality of detection position groups G. Accordingly, it is possible to effectively avoid a situation in which the regeneration of the signal level becomes impossible in a part of the detection position groups G.

(Second Modification of Polarity Pattern P)

FIG. 11 is a diagram illustrating a second modified example of the polarity pattern P. The polarity pattern P illustrated in FIG. 11 differs from the polarity pattern P illustrated in FIG. 3 in that, from among the 14 detection positions $S_1$ to $S_{14}$, seven detection positions $S_1, S_3, \ldots, S_{13}$ respectively having suffixes of an odd number belong to a 1st detection position group $G_1$. and seven detection positions $S_2, S_4, \ldots$, and $S_{14}$ respectively having suffixes of an even number correspond to a 2nd detection position group $G_2$.

FIGS. 12A and 12B illustrate the partial polarity pattern PB included in the polarity pattern P of FIG. 11. FIG. 12A illustrates seven 1st partial polarity patterns $PB_1^{(1)}$ to $PB_7^{(1)}$ used to generate seven composite detection signals $a_1$ to $a_7$ corresponding to the 1st detection position group $G_1$. FIG. 8B illustrates seven 2nd partial polarity patterns $PB_8^{(2)}$ to $PB_{14}^{(2)}$ used to generate seven composite detection signals $a_8$ to $a_{14}$ corresponding to 2nd detection position group $G_2$.

FIGS. 13A to 13B are diagrams for explaining the relationship between the detection signal of each detection position group G and the composite detection signal a when the polarity pattern P illustrated in FIG. 11 is used, and represents a matrix determinant corresponding to Formula 5. FIG. 13A illustrates that the product of the 1st polarity pattern matrix D1 and the 1st signal level matrix $C_1$ is equal to the 1st composite detection signal matrix $A_1$, and FIG. 13B illustrates that the product of the 2nd polarity pattern matrix $D_2$ and the 2nd signal level matrix $C_2$ is equal to the 2nd composite detection signal matrix $A_2$. The elements of the signal level matrices $C_1$ and $C_2$ illustrated in FIGS. 13A and 13B are those partially replacing the elements of the signal level matrices $C_1$ and $C_2$ illustrated in FIGS. 5A and 5B.

FIGS. 14A and 14B are diagrams illustrating a method for calculating the signal level of a detection signal using the polarity pattern P illustrated in FIG. 11, and represent a matrix determinant corresponding to Formula 7-2. FIG. 14A illustrates that the product of the 1st composite detection signal matrix $A_1$ and the inverse matrix $4 \cdot D_1^{-1}$ is equal to 4 times of the respective elements of the 1st signal level matrix C1. FIG. 14B illustrates that the product of the 2nd composite detection signal matrix $A_2$ and the inverse matrix $4 \cdot D2^{-1}$ is equal to 4 times of the respective elements of the 2nd signal level matrix $C_2$. The inverse matrix ($D_1^{-1}$, inverse matrix $D_2^{-1}$) in this variation is the same as that in FIG. 5C. The elements of the signal level matrices $C_1$ and $C_2$ illustrated in FIGS. 14A and 14B are partially replaced by the elements of the signal level matrices $C_1$ and $C_2$ illustrated in FIGS. 6A and 6B.

As described above, when N detection positions S are arranged in a single direction, two adjacent detection positions S may belong to different detection positions G. For example, as illustrated in FIG. 11, a detection position S belonging to the 1st detection position group $G_1$ and a detection position S belonging to the 2nd detection position group $G_2$ may be alternately arranged. The location of the detection position S is spatially dispersed in each detection position group G, so that the influence of noise on the signal level regenerated by the signal regeneration unit 320 can be dispersed in a plurality of detection position groups G even when noise is concentrated and propagated in a certain location. Accordingly, it is possible to effectively avoid a situation in which the regeneration of the signal level becomes impossible at of n some detection position groups G.

(Third Modified Example 68 of Polarity Pattern P)

Figure 15:
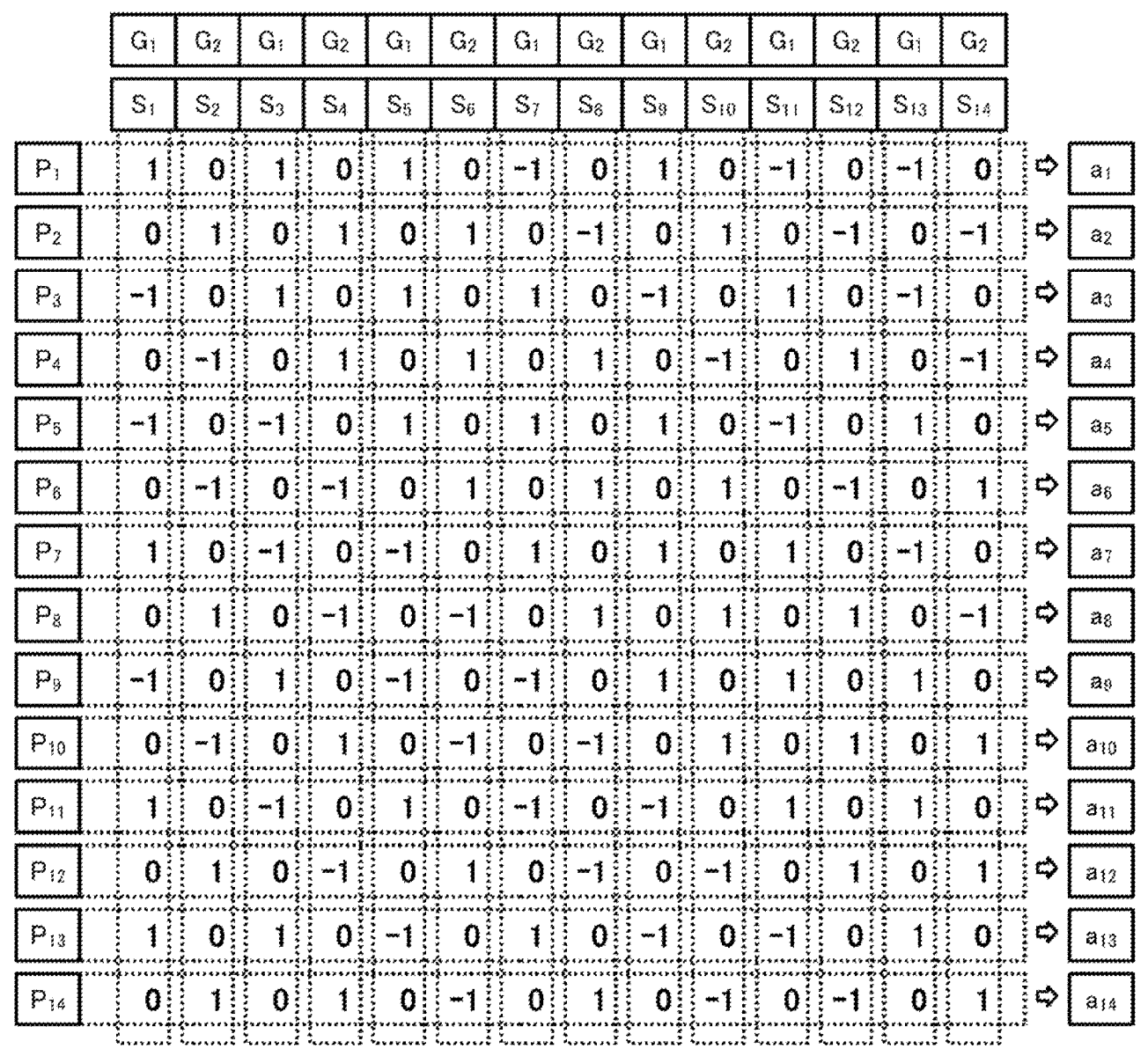

FIG. 15 is a diagram illustrating a third modification of the polarity pattern P. The polarity pattern P illustrated in FIG. 15 differs from the polarity pattern P illustrated in FIG. 3 in that, from among 14 composite detection signals $a_1$ to $a_{14}$, the seven composite detection signals with an odd index correspond to the 1st detection position group $G_1$, and the seven composite detection signals with an even index correspond to the 2nd detection position group $G_2$. In addition, the polarity pattern P illustrated in FIG. 5 differs from the polarity pattern P shown in FIG. 3 in that of the 14 detection positions $S_1$ to $S_{14}$, seven detection positions $S_1, S_3, \ldots, S_{13}$ with an odd index belong to the 1st detection position group $G_1$, and the subscripts of seven detection positions $S_2, a_4, \ldots,$ and $a_{14}$ with an even index correspond to the 2nd detection position group $G_2$.

Figure 16A:
FIGS. 16A and 16B illustrate a partial polarity pattern included in the polarity pattern of FIG. 15.
Figure 16B:

FIGS. 16A to 16B illustrate the partial polarity pattern PB included in the polarity pattern P of FIG. 15. FIG. 16A illustrates seven composite detection signals $a_1, a_3, \ldots,$ and $a_{13}$ corresponding to the 1st detection position group $G_1$, seven 1st partial polarity patterns $PB_1^{(1)}, PB_3^{(1)}, \ldots,$ and $PB_{13}^{(1)}$ used for generation. FIG. 16B illustrates seven composite detection signals $a_2, a_4, \ldots,$ and $a_{14}$, which correspond to the 2nd detection position group $G_2$, and seven 2nd partial polarity patterns $PB_2^{(2)}, PB_4^{(2)}, \ldots,$ and $PB_{14}^{(2)}$.

FIGS. 17A and 17B are diagrams for explaining the relationship between the detection signal of each detection position group G and the composite detection signal a using the polarity pattern P illustrated in FIG. 15, and represent a matrix determinant corresponding to Formula 5. FIG. 17A illustrates that the product of the 1st polarity pattern matrix $D_1$ and the 1st signal level matrix $C_1$ is equal to the 1st composite detection signal matrix $A_1$, and FIG. 17B illustrates that the product of the 2nd polarity pattern matrix $D_2$ and the 2nd signal level matrix $C_2$ is equal to that of the 2nd composite detection signal matrix $A_2$. The elements of the composite detection signal matrices $A_1$ and $A_2$ illustrated in FIGS. 17A and 17B are that partially replaced by the elements of the composite detection signal matrices $A_1$ and $A_2$ illustrated in FIGS. 5A and 5B. The elements of the signal level matrices $C_1$ and $C_2$ illustrated in FIGS. 17A and 17B are that partially replace the elements of the signal level matrices $C_1$ and $C_2$ illustrated in FIGS. 5A and 5B.

FIGS. 18A and 18B are diagrams illustrating a method for calculating the signal level of a detection signal using the polarity pattern P illustrated in FIG. 15, and represents a matrix determinant corresponding to Formula 7-2. FIG. 18A illustrates that the product of the 1st composite detection signal matrix A1 and the inverse detection signal matrix $4 \cdot D_1^{-1}$ is equal to 4 times of the respective elements of the 1st signal level matrix $C_1$, and FIG. 18B illustrates that the product of the 2nd composite detection signal matrix $A_2$ and the inverse detection signal matrix $4 \cdot D_2^{-1}$ is equal to 4 times of the respective elements of the 2nd signal level matrix $C_2$. The inverse matrix ($D_1^{-1}$, inverse matrix $D_2^{-1}$) in this modified example is the same as that in FIG. 5C. The elements of the composite detection signal matrices $A_1$ and $A_2$ illustrated in FIGS. 18A and 18B are partially replaced by the elements of the composite detection signal matrices $A_1$ and $A_2$ illustrated in FIGS. 6A and 6B. The elements of the signal level matrices $C_1$ and $C_2$ illustrated in FIGS. 18A and 18B are those partially replacing the elements of the signal level matrices $C_1$ and $C_2$ illustrated in FIGS. 6A and 6B.

As described above, in this modified example, two composite detection signals a corresponding to different detection position groups G ($G_1$ and $G_2$) are continuously generated back and forth, and the two adjacent detection positions S belong to the different detection position groups G. Thus, the timing of generating the composite detection signal a is dispersed in time for each detection position group G, and the location of the detection position S is spatially dispersed in each detection position group G. Therefore, the influence of noise on the signal level regenerated by the signal regeneration unit 320 can be more effectively dispersed into a plurality of detection position groups G.

(Fourth Modified Example of Polarity Pattern P)

FIG. 19 is a diagram illustrating a fourth modification of the polarity pattern P. In the example of FIG. 19, the number of detection positions S is 12 (N=12), and the number of composite detection signals a generated by the sensor unit 200 to regenerate the signal level at each detection position S is 14 (M=14). The number M of the composite detection signals a exceeds the number N of the detection positions S. The seven detection positions $S_1, S_3, S_5, S_7, S_9, S_{11},$ and $S_{12}$ belong to the 1st detection position group $G_1$ (K(1)=7), and the seven detection positions $S_1, S_2, S_4, S_6, S_8, S_{10},$ and $S_{12}$ also belong to the 2nd detection position group $G_2$.

In this variation, the detection positions $S_1$ and $S_{12}$ belong to detection position group G ($G_1$ and $G_2$), respectively. Hereinafter, detection positions S ($S_1$ and $S_{12}$) belonging to the plurality of detection position groups G may be referred to as "overlapping detection position".

FIGS. 20A and 20B illustrate the partial polarity pattern PB included in the polarity pattern P of FIG. 19. FIG. 20A illustrates seven 1st partial polarity patterns $PB_1^{(1)}$ to $PB_7^{(1)}$ used to generate seven composite detection signals $a_1$ to $a_7$ corresponding to the 1st detection position group $G_1$. FIG. 20B illustrates seven 2nd partial polarity patterns $PB_8^{(2)}$ to $PB_{14}^{(2)}$ used to generate seven composite detection signals $a_8$ to $a_{14}$ corresponding to 2nd detection position group $G_2$.

FIGS. 21A and 21B are diagrams for explaining the relationship between the detection signal of each detection position group G and the composite detection signal a using the polarity pattern P illustrated in FIG. 19, and represent the matrix determinant corresponding to Formula 5. FIG. 21A illustrates that the product of the 1st polarity pattern matrix D1 and the 1st signal level matrix $C_1$ is equal to the 1st composite detection signal matrix $A_1$, and FIG. 21B illustrates that the product of the 2nd polarity pattern matrix $D_2$ and the 2nd signal level matrix $C_2$ is equal to the 2nd composite detection signal matrix $A_2$. As illustrated in FIGS. 21A and 21B, the signal levels $c_1$ and $c_2$ of the detection signals obtained at the overlapping detection positions $S_i$ and $S_{12}$ are used to generate the composite detection signals $a_1$ to $a_7$ corresponding to the 1st detection position group $G_1$, and also used to generate the composite detection signals $a_8$ to $a_{14}$ corresponding to the 2nd detection position group $G_2$.

FIGS. 22A and 22B are diagrams illustrating a method for calculating the signal level of a detection signal using the polarity pattern P illustrated in FIG. 19, and represent a matrix determinant corresponding to Formula 7-2. FIG. 22A illustrates that the product of the 1st composite detection signal matrix $A_1$ and the inverse matrix $4 \cdot D_1^{-1}$ is equal to 4 times of the respective elements of the 1st signal level matrix $C_1$, while FIG. 22B illustrates that the product of the 2nd composite detection signal matrix $A_2$ and the inverse matrix $4 \cdot D_2^{-1}$ is equal to 4 times of the respective elements of the 2nd signal level matrix $C_2$. The inverse matrix ($D_1^{-1}$, inverse matrix $D_2^{-1}$) in this modified example is the same as that in FIG. 5C. The signal regeneration unit 320 calculates two solutions respectively for the signal levels $c_1$ and $c_2$ of the overlapping detection positions $S_1$ and $S_{12}$ through two operations illustrated in FIGS. 21A and 21B.

The signal regeneration unit 320 may regenerate the average of the calculated two or greater signal levels as the signal levels obtained at the overlapping detection position when calculating two or greater signal levels for the overlapping detection position belonging to two or greater detection position groups G based on an operation equivalent to the multiplication of the inverse matrix $D^{-1}$ and the composite detection signal matrix A. For example, the signal regeneration unit 320 may calculate the average of the two solutions calculated as the signal levels $c_1$ and $c_2$ of the overlapping detection positions $S_1$ and $S_{12}$, respectively, and acquire the result as the regeneration result of the signal levels $c_1$ and $c_2$. This effectively reduces the effect of noise on the regenerated signal level because the average of the two or greater signal levels calculated for the overlapping detection position is obtained as a result of the regeneration of the signal level at the overlapping detection position. In particular, in an example of the polarity pattern P example of FIG. 19, because the end detection positions $S_1$ and $S_{12}$ in the array of 12 detection positions S aligned in one direction are the overlapping detection positions, the noise that is likely to influence at the end of the detection region 235 can be effectively reduced in general.

(Fifth Modified Example of Polarity Pattern P)

Figure 23:
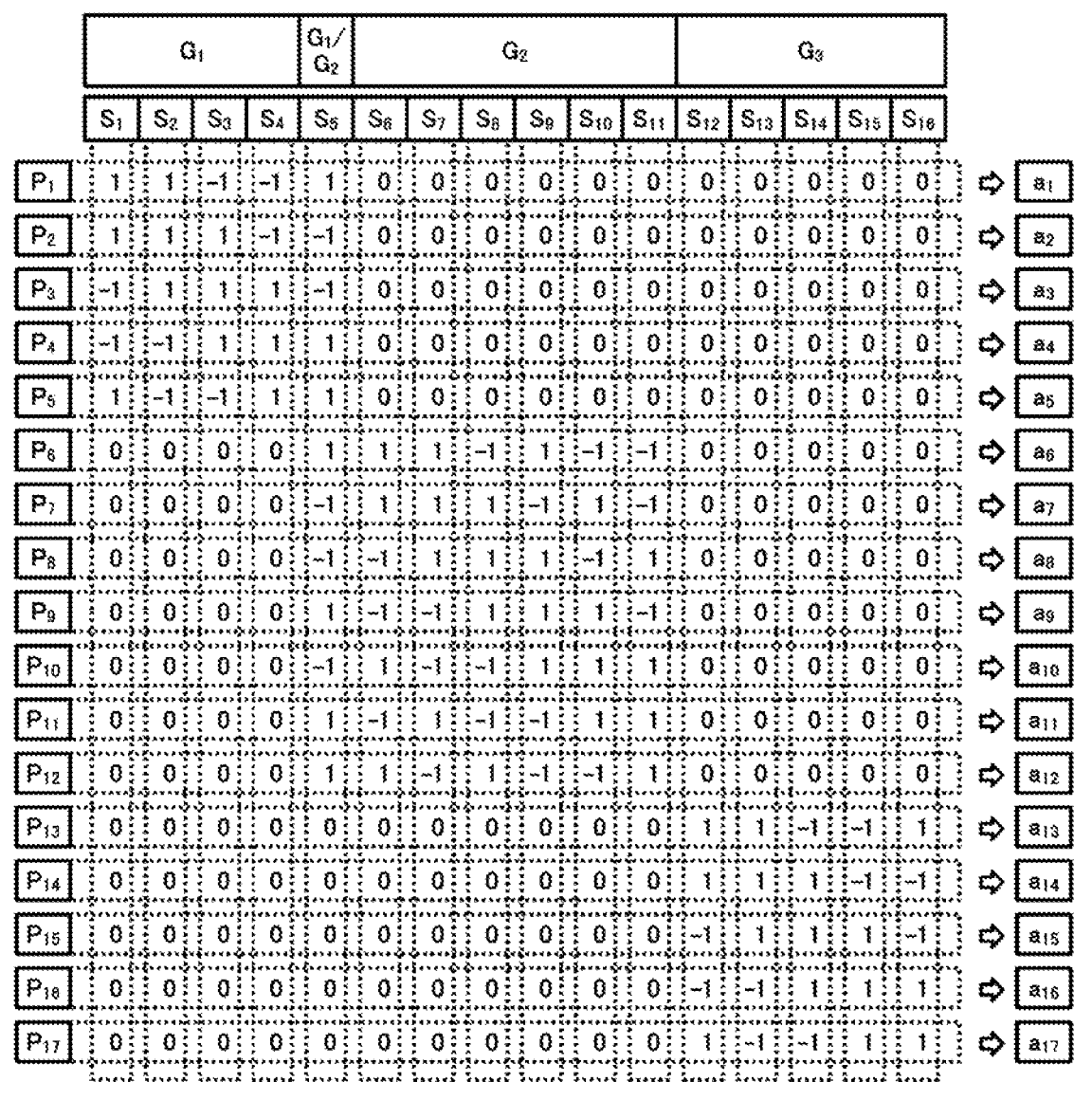

FIG. 23 is a diagram illustrating a fifth modified example of the polarity pattern P. In the example of FIG. 23, the number of detection positions S is 16 (N=16), and the number of composite detection signals a generated by the sensor unit 200 to regenerate the signal level at each detection position S is 17 (M=17). Five detection positions S1 to S5 belong to the 1st detection position group $G_1$ (K(1)=5), seven detection positions $S_5$ to $S_{11}$ belong to the 2nd detection position group $G_2$ (K(2)=7), and five detection positions $S_{12}$ to $S_{16}$ belong to the 3rd detection position group $G_3$ (K(3)=5). The composite detection signals $a_1$ to $a_5$ of 5 (K(1)) correspond to the 1st detection position group $G_1$, 7 (K(2)) composite detection signals $a_6$ to $a_{12}$ correspond to 2nd detection position group $G_2$, and 5 (K(3)) composite detection signals $a_{13}$ to $a_{17}$ correspond to 3rd detection position group $G_3$.

In this modified example, the detection position S5 is an overlapping detection position belonging to two detection position groups G ($G_1$, $G_2$).

FIGS. 24A to 24C illustrate the partial polarity pattern PB included in the polarity pattern P illustrated in FIG. 23. FIG. 24A illustrates five 1st partial polarity patterns $PB_1^{(1)}$ to $PB_5^{(1)}$ used to generate five composite detection signals a1 to a5 corresponding to the 1st detection position group $G_1$. FIG. 24B illustrates seven 2nd partial polarity patterns $PB_6^{(2)}$ to $PB_{12}^{(2)}$ used to generate seven composite detection signals $a_6$ to $a_{12}$ corresponding to the 2nd detection position group $G_2$. FIG. 24C illustrates five 3rd partial polarity patterns $PB_{13}^{(3)}$ to $PB_{17}^{(3)}$ used to generate the five composite detection signals $a_{12}$ to $a_{16}$ corresponding to the 3rd detection position group $G_3$.

FIGS. 25A to 25C are diagrams for explaining the relationship between the detection signals of each detection position group G and the composite detection signal in a case where the polarity pattern P illustrated in FIG. 23, and represent a matrix determinant corresponding to Formula 5. FIG. 25A illustrates that the product of the 1st polarity pattern matrix $D_1$ and the 1st signal level matrix $C_1$ is equal to the 1st composite detection signal matrix $A_1$. FIG. 25B illustrates that the product of the 2nd polarity pattern matrix $D_2$ and the 2nd signal level matrix $C_2$ is equal to the 2nd composite detection signal matrix $A_2$. FIG. 25C illustrates that the product of the 3rd polarity pattern matrix $D_3$ and the 3rd signal level matrix $C_3$ is equal to the 3rd composite detection signal matrix $A_3$.

FIGS. 26A and 26B illustrate the inverse matrix $D^{-1}$ of the polarity pattern matrix D. FIG. 26A illustrates the inverse matrix $D_1^{-1}$ of the 1st polarity pattern matrix $D_1$ and the inverse matrix $D_3^{-1}$ of the 3rd polarity pattern matrix $D_3$. FIG. 26B illustrates the inverse matrix $D_2^{-1}$ of the 2nd polarity pattern matrix $D_2$. The inverse matrix $D_2^{-1}$ illustrated in FIG. 26B is the same as in FIG. 5C.

FIGS. 27A to 27C are diagrams illustrating a method for calculating the signal level of the detection signal using the polarity pattern P illustrated in FIG. 23, and represents the matrix determinant corresponding to Formula 7-2. FIG. 27A illustrates that the product of the 1st composite detection signal matrix $A_1$ and the inverse detection signal matrix $2 \cdot D_1^{-1}$ is equal to 2 times of the elements of the 1st signal level matrix $C_1$. FIG. 27B illustrates that the product of the 2nd composite detection signal matrix $A_2$ and the inverse detection signal matrix $4 \cdot D_2^{-1}$ is equal to 4 times of the elements of the 2nd signal level matrix $C_2$. FIG. 27C illustrates that the product of the 3rd composite detection signal matrix $A_3$ and the inverse matrix $2 \cdot D_3^{-1}$ is equal to 2 times of the elements of the 3rd signal level matrix $C_3$. Because each element of the inverse matrix ($2 \cdot D_1^{-1}$, $4 \cdot D_2^{-1}$, $2 \cdot D_3^{-1}$) is "1" or "0", the products of matrices illustrated in FIGS. 27A to 27C is a simple operation of adding a part of elements of the composite detection signal matrices A ($A_1$, $A_2$, $A_3$).

As in the present modification, the detection position group G may be 3 or greater, and in this case, the polarity pattern matrix D can be independently selected for each detection position group G. In addition, the number K (the size of the polarity pattern matrix D) of the detected positions S included in the detection position group G need not be the same for all detection position groups G, and the detection position group G having a different number K may be included as in the present modification.

The overlapping detection position need not be at the end of the array of the detection position S as illustrated in FIG. 19, but may be intermediate to the array of the detection position S as in this modified example. In addition, the solution of the plurality of signal levels calculated for a single overlapping detection position need not be averaged as in the fourth modified example. If the influence of the noise is small, one solution in the solution of the plurality of signal levels may be calculated as a regenerated value of the signal level, and the solution of a remaining signal level may be ignored or may not be calculated.

Second Embodiment

Figure 28:
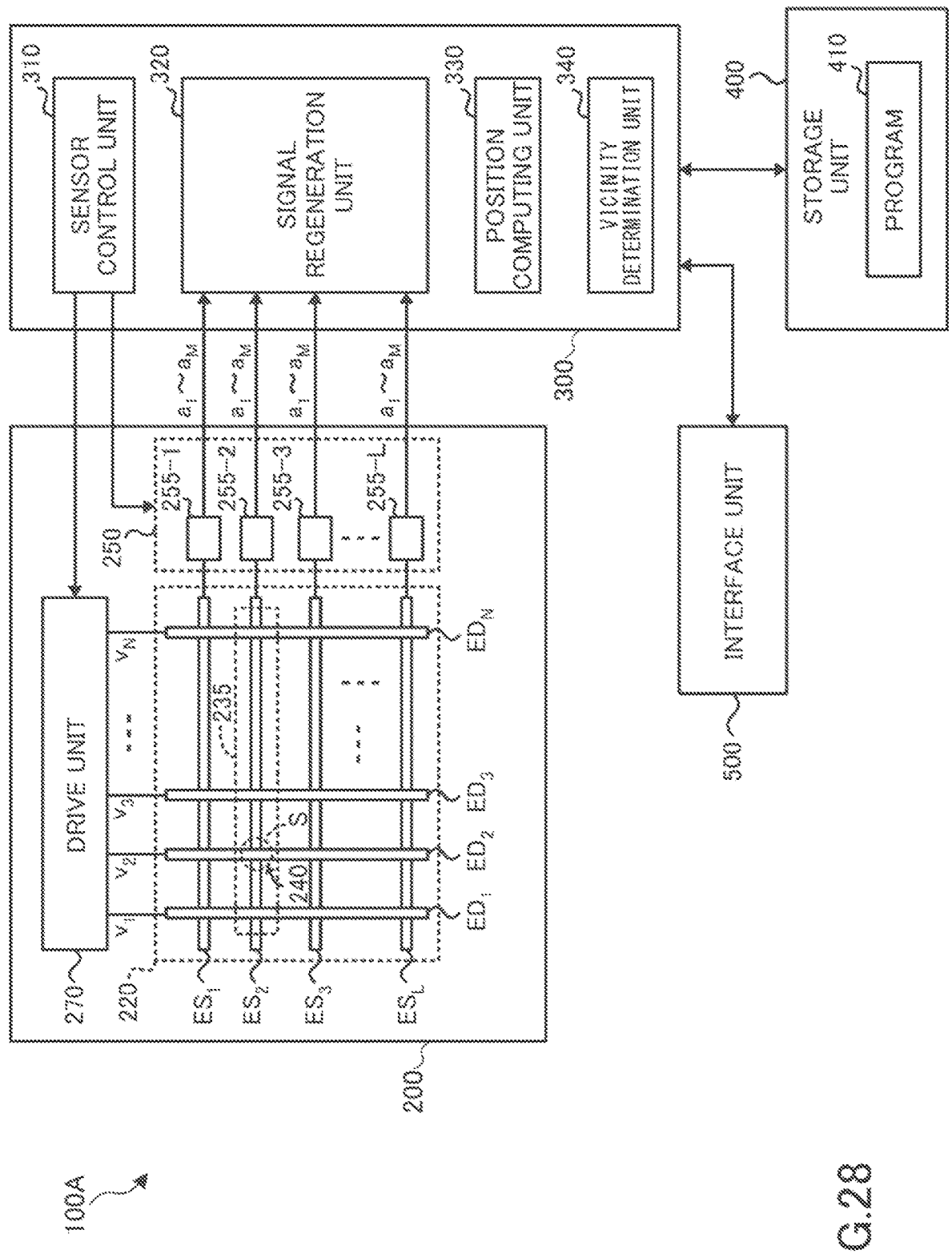
FIG. 28 is a diagram illustrating an example of a Structure of an input device according to the second embodiment.

Next, a second embodiment will be described. FIG. 28 is a diagram illustrating an example of the structure of the input device 100A according to the second embodiment. The input device 100A illustrated in FIG. 28 has a structure substantially similar to the input device 100 illustrated in FIG. 1 and includes a vicinity determination unit 340 as a structure included in the processing unit 300.

In the input device 100A according to the second embodiment, two adjacent detection positions S belong to different detection position groups G, and the detection positions S of each detection position group G are spatially dispersed, as in the example of the polarity pattern P illustrated in FIG. 11.

In order to regenerate the signal level of the detection signal obtained at the N detection positions S, the sensor control unit 310 periodically repeats the detection process of sequentially generating M composite detection signals a, and controls the sensor unit 200 so as to continuously generate K(r) composite detection signals a corresponding to the r-th detection position group $G_r$ in the detection process of one cycle. For example, in the polarity pattern P illustrated in FIG. 11, the polarity patterns $P_1$ to $P_7$ of the 1st detection position group $G_1$ are continuously generated, followed by the polarity patterns $P_8$ to $P_{14}$ of the 2nd detection position group $G_2$.

The signal regeneration unit 320 regenerates the signal levels at the K(r) detection positions S belonging to the r-th detection position group $G_r$ every time that K(r) composite detection signals a corresponding to the r-th detection position group $G_r$ are continuously generated. For example, in the polarity pattern P illustrated in FIG. 11, when the polarity patterns $P_1$ to $P_7$ of the 1st detection position group $G_1$ are continuously generated, signal levels $c_1$, $c_3$, ..., and $c_{13}$ are regenerated by the operation illustrated in FIG. 14A, then the polarity patterns $P_8$ to $P_{14}$ of the 2nd detection position group $G_2$ are continuously generated, and the signal levels $c_2$, $c_4$, ..., and $c_{14}$ are regenerated by the calculation illustrated FIG. 14B.

The position computing unit 330 updates the calculation result of the proximity position of an object based on the signal level at a plurality of detection positions S (L detection regions 235) including the signal level at the regenerated K(r) detection positions S every time the signal level at the K(r) detection positions S belonging to the r-th detection position group $G_r$ is regenerated in the signal regeneration unit 320.

The vicinity determination unit 340 determines whether the object (for example, a finger) is positioned in the vicinity of L detection regions 235 based on the composite detection signal a periodically generated by repeating the detection process. For example, the vicinity determination unit 340 may determine whether there is a proximate object based on the composite detection signal a generated for the L detection regions 235 or may determine whether there is an object having a specific shape (e.g., a finger) proximate to the L detection regions 235 based on the signal level of each detection position S regenerated by the signal regeneration unit 320 using the composite detection signal a. The sensor control unit 310 changes a repetition period of the detection process in conformity with the determination result of the vicinity determination unit 340. For example, the sensor control unit 310 shortens the repetition period of the detection process in a case where it is determined that the object is proximate to the L detection regions 235 in the vicinity determination unit 340, and increases the repetition period of the detection process in a case where it is determined that the object is not proximate.

Figure 29:
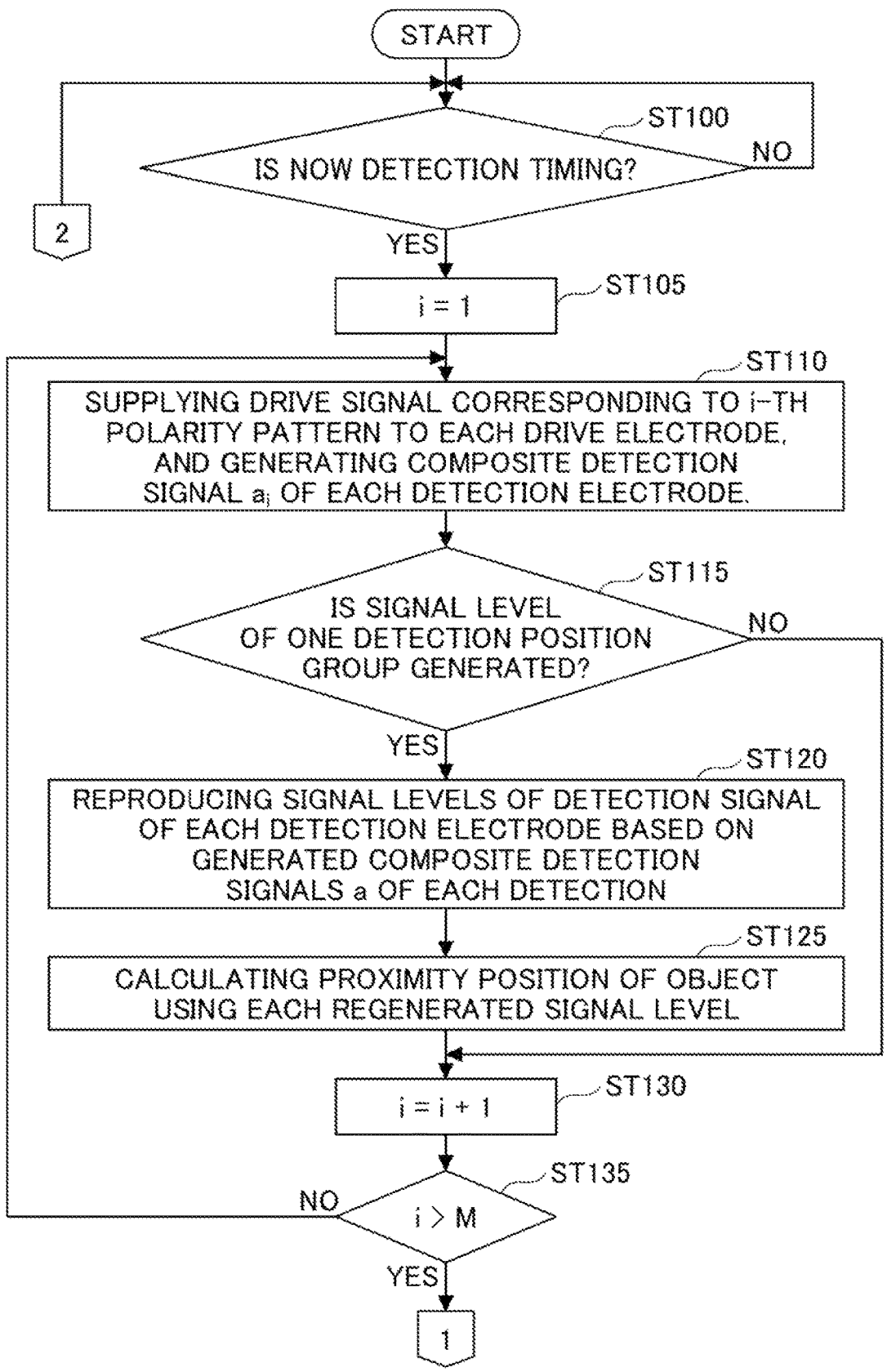
FIG. 29 is a first flowchart illustrating an operation related to the generation of a composite detection signal and the regeneration of a detection signal level in the second embodiment.
Figure 30:
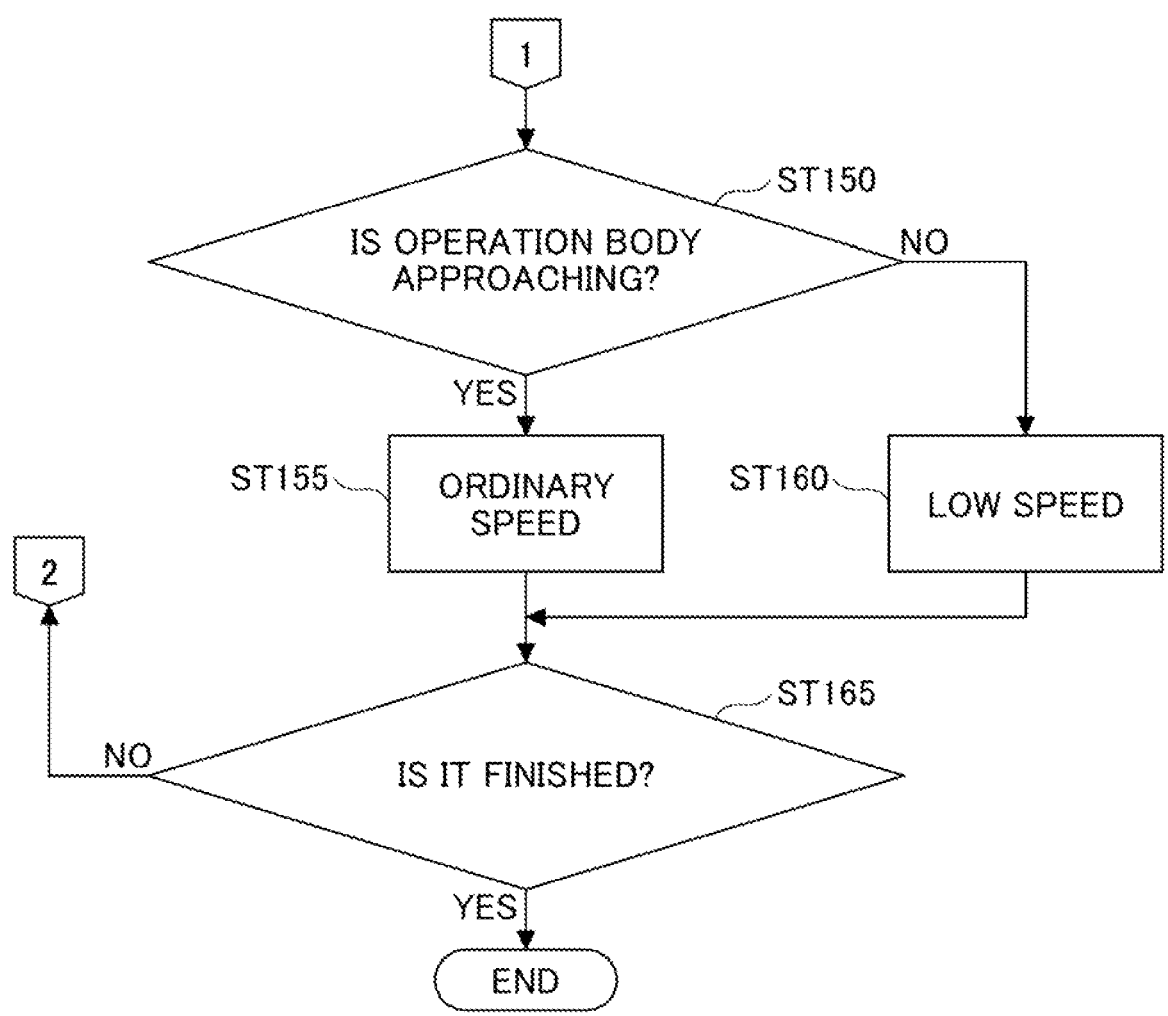
FIG. 30 is a second flowchart illustrating an operation related to the generation of a composite detection signal and the regeneration of a detection signal level in the second embodiment.

FIGS. 29 and 30 are a first flowchart illustrating an operation related to the generation of the composite detection signal a and the regeneration of the signal level of the detection signal in the second embodiment. The sensor control unit 310 determines whether a periodic detection timing to generate the composite detection signal a of each detection position S arrives (ST100). When it is determined that the periodic detection timing arrives (YES of the ST100), the sensor control unit 310 controls the drive unit 270 so as to set a variable i to an initial value of 1 (ST105) and to supply the drive signals v1 to vN, which are set to have a polarity by the polarity pattern $P_i$, to the drive electrodes ED1 to EDN. The sensor control unit 310 controls each detection circuit 255 of the composite detection signal generation unit 250 so as to generate the composite detection signal $a_i$ of each detection electrode ES in accordance with the timing of the supply of the driving signals v1 to vN (ST110).

After step ST110 is completed, the sensor control unit 310 increments the variable i by 1 (ST130) and repeats the processing of step ST105 and succeeding steps if the variable i is M or less (NO of ST135), which will be described later. Accordingly, the sensor control unit 310 repeats the processing of the step ST110 until the M composite detection signals $a_1$ to $a_M$ are generated.

Here, in the generation order of the composite detection signals $a_1$ to $a_M$, K composite detection signals a corresponding to each detection position group G are consecutive. Therefore, while the variable i increments from 1 to M, the generation of K composite detection signals a corresponding to each detection position group G is successively completed. In the example of FIG. 11, seven composite detection signals a are generated in the order of the 1st detection position group $G_1$ and the 2nd detection position group $G_2$.

After step ST110, the signal regeneration unit 320 determines whether the K composite detection signals a corresponding to the single detection position group G have been completely generated (ST115). If not, the processing goes to step ST130, and if it has been completed, goes to step ST120.

When the K composite detection signals a corresponding to one detection position group G is completely generated (YES of ST115), the signal regeneration unit 320 regenerates the signal level at the K detection positions S of each detection electrode ES based on the K composite detection signals a of each detection electrode ES when the generation is completed (ST120). When the signal level at the K detection positions S of each detection electrode ES is regenerated, the position computing unit 330 updates a calculation result of the proximity position of an object based on the signal level at a plurality of detection positions S (L detection regions 235) including the signal level at a portion of the regenerated detection positions S (K detection positions S of each detection electrode ES). That is, the position computing unit 330 replaces a portion of the previously regenerated L detection regions 235 at the signal level with the latest signal level regenerated by the step ST120, and calculates the position of an object proximate to the L detection regions 235 using the signal level of the L detection regions 235 partially updated by the replacement.

When the variable i is larger than M (YES in ST135), the process proceeds to ST150. In step ST150, the vicinity determination unit 340 determines whether the object (e.g., the finger) is positioned in the vicinity of the L detection regions 235 based on the composite detection signal a periodically generated by repeating the detection process (ST150). The sensor control unit 310 sets the speed of the detection process to an ordinary speed (ST155) in a case where it is determined that the object is proximate by the vicinity determination unit 340 (YES of the ST150) and decreases the speed of the detection process to a lower speed (to have longer repetition period) in a case where it is determined that the object is not proximate to the vicinity determination unit 340 (NO of the ST150). When the detection process is continued (YES of ST165), the processing unit 300 returns to the step ST100 and repeats the above-described processing.

As described above, according to the present embodiment, in N detection positions S arranged in one direction, two adjacent detection positions S belong to different detection positions G, and thus a plurality of detection positions S belonging to each detection position group G are spatially dispersed. In addition, every time K(r) composite detection signals a corresponding to the r-th detection position group $G_r$ are continuously generated in the detection process of one cycle, the signal level at the K(r) detection positions S belonging to the r-th detection position group $G_r$ is regenerated. This allows the signal level of the r-th detection position group Gr including the K(r) detection positions S spatially dispersed to be regenerated in a short period of time being one cycle.

According to the present embodiment, every time the signal level at the K(r) detection position S belonging to the r-th detection position group $G_r$ is regenerated in the signal regeneration unit 320, the calculation result of the proximity position of the object is updated based on the signal level at the plurality of detection positions S (L detection regions 235) including the signal level at the regenerated K(r) detection positions S. Therefore, it is possible to update the calculation result of the position in a time shorter than one cycle.

Further, according to the present embodiment, the repeated period of the detection process can be changed depending on whether the object is positioned in the vicinity of the plurality of detection positions S (L detection regions 235). For example, when the object is not positioned in the vicinity of the L detection regions 235, the power consumption can be reduced by increasing the repeated period of the detection process.

The present invention is not limited to the embodiments described above and includes various variations.

For example, in the above-described embodiment, the sensor unit 200 of the electrostatic capacitance type is used to combine the electric charges of the detection element 240 (a capacitor) whose electrostatic capacitance varies according to the proximity state of the object and outputs it as the composite detection signal a. However, the present invention is not limited to this example. That is, the present invention is applicable to input devices having various types of detection elements whose physical quantities vary depending upon the proximity of the object.

Effects of the Invention

According to the present disclosure, when the original detection signal is regenerated from the sum of the plurality of detection signals obtained at the plurality of detection positions, the degree of freedom of selection of the matrix defining the polarity pattern of the plurality of detection signals can be increased.

DESCRIPTION OF SYMBOLS 100, 100A: input device;
200: sensor unit;
220: electrode unit;
230: detection position;
235: detection region;
240: detection element;
250: composite detection signal generation unit;
255: detection circuit;
270: drive unit;
ES: detection electrode;
ED: drive electrode;
300: processing unit;
310: sensor control unit;
320: signal regeneration unit;
330: position computing unit;
340: vicinity determination unit;
400: storage unit;
410: program; and
500: interface unit.

What is claimed is:

1. An input device for inputting information in conformity with a proximity state of an object at a plurality of detection positions, the input device comprising:

a sensor unit which can detect the proximity state of the object at N detection positions, generating a composite detection signal corresponding to the sum of N detection signals obtained as a result of the detection for the N detection positions, and controlling a positive or negative polarity of the detection signal having a signal level corresponding to the proximity state at each of the N detection positions;

at least one processor; and a memory in which a program to be executed by the at least one processor;

wherein, when the at least one processor executes the program, the at least one processor performs a sensor control for controlling the sensor unit so as to generate the M composite detection signals (M is an integer of N or greater) having a polarity pattern of the N polarities that are set to N detection signals differ from one another, and signal regeneration of regenerating the signal level of the N detection signals based on the M composite detection signals generated by the sensor unit, wherein each of the N detection positions belongs to a portion of a r-th detection position group, the r-th detection position group includes a 1st detection position group to a R-th detection position group, the r-th detection position group (r represents an integer from 1 to R), K(r) detection positions (K(r) represents an integer of 2 or greater) includes the detection position, K(r) polarities to be set to the K(r) detection signals obtained for the K(r) detection positions that belong to the r-th detection position group is called a r-th partial polarity pattern, the positive or negative polarity set to the detection signal is represented by "1" or "−1", the polarity set to the detection signal that is not added to the composite detection signal is represented by "0", the r-th partial polarity pattern is represented by the 1-row K(r)-columns r-th partial matrix respectively having values of "1", "−1", or "0", each of the M composite detection signals corresponds to any one of the r-th detection position groups, and K(r) composite detection signals correspond to the r-th detection position group, the K(r) composite detection signals correspond to the r-th detection position group, each of the K(r) polarity patterns used to generate the K(r) composite detection signals includes the one r-th partial polarity pattern and all the polarities other than the one r-th partial polarity pattern are "0", the K(r) r-th partial polarity patterns included in the K(r) polarity pattern are represented by the K(r)-rows K(r)-columns r-th polarity pattern matrix including the K(r) r-th partial matrices, and the at least one processor regenerates, in a case where the signal regeneration is performed, the signal levels of the K(r) detection signals obtained for the K(r) detection positions belonging to the r-th detection position group based on a calculation corresponding to a multiplication of an inverse matrix with respect to the r-th polarity pattern matrix and a K(r)-rows 1-column composite detection signal matrix having the K(r) composite detection signals as an element.

2. The input device according to claim 1,
wherein the at least one processor controls, in a case where the sensor control is executed, the sensor unit so that the M composite detection signals are generated sequentially and two composite detection signals corresponding to different detection position groups are generated continuously back and forth.

3. The input device according to claim 1, wherein the N detection positions are aligned along one direction, and
two adjacent detection positions belong to different detection position groups.

4. The input device according to claim 1, wherein the N detection positions are aligned along one direction,
two adjacent detection positions belong to different detection position groups, and
in the case where the sensor control is executed, the at least one processor periodically repeats the detection process of sequentially generating the M composite detection signals, continuously generates the M composite detection signals corresponding to the r-th detection position group are continuously generated, and
in a case where the signal regeneration is performed, the at least one processor regenerates the signal level at the K(r) detection position belonging to the r-th detection position group each time the K(r) composite detection signals corresponding to the r-th detection position group are generated.

5. The input device according to claim 4,
wherein the at least one processor performs a position calculation of calculating a position to which the object is proximate based on the signal level at the plurality of detection positions including the signal levels of the N detection signals regenerated by the signal regeneration when the program is executed, and
in a case where the position calculation is performed, the at least one processor updates a position calculation result based on the signal level at the plurality of detection positions including the signal level at the regenerated K(r) detection positions every reproducing of the signal level at the K(r) detection positions belonging to the r-th detection position group.

6. The input device according to claim 4,
wherein the at least one processor performs, when executing the program, proximity determination of determining whether the object is positioned in the vicinity of the plurality of detection positions based on the composite detection signal periodically generated by repeating the detection process, and the at least one processor changes the repetition period of the detection process in accordance with a determination result of the vicinity determination when performing in a case where the sensor control is performed.

7. The input device according to claim 1,
wherein, in a case where the at least one processor performs the signal regeneration when two or greater signal levels are calculated based on a calculation corresponding to the multiplication of the inverse matrix and the composite detection signal matrix to obtain the overlapping detection position that is the detection position belonging to the two or greater detection position groups,
the at least one processor calculates an average of the two or greater calculated signal levels as the signal level obtained for the overlapping detection position.

8. The input device according to claim 7,
wherein the N detection positions are aligned along one direction, and
at least one of the detection positions at both ends of an array of the N detection positions is the overlapping detection position.

9. The input device according to claim 1,
wherein the sensor unit includes
a plurality of detection elements disposed corresponding to the plurality of detection positions, the plurality of detection elements having a signal level corresponding to the proximity state of the object and generating the detection signal whose polarity is set to "1", "−1", or "0" in conformity with the input drive signal,
a drive unit that respectively supplies the drive signal to the plurality of detection elements in conformity with the sensor control, and
a composite detection signal generation unit that generates the composite detection signal corresponding to a sum of the N detection signals generated by N detection elements corresponding to the N detection positions.

10. The input device according to claim 9,
wherein the sensor unit includes
at least one detection electrode, and
a plurality of drive electrodes intersecting the detection electrodes,
wherein the detection element is a capacitor formed at an intersection of the detection electrode and the drive electrodes, and an electrostatic capacitance varies in conformity with the proximity state of the object,
the drive unit supplies the drive signal to each of the plurality of drive electrodes,
N capacitors as the N detection elements are formed between one of the detection electrodes and N of the drive electrodes, and
the composite detection signal generation unit generates the composite detection signal based on the charge of the N capacitors transmitted to the detector electrode in response to the N drive signals supplied to the N drive electrodes.

11. A control method of an input device for inputting information according to a proximity state of an object at a plurality of detection positions, the input device detecting the proximity state of the object at N detection positions, generates a composite detection signal corresponding to a sum of N detection signals obtained as a result of the detecting of the proximity state for the N detection positions, and has a sensor unit capable of controlling a positive or negative polarity for the detection signal having a signal level corresponding to the proximity state at each of the N detection positions,
the control method comprises:
controlling the sensor unit so as to generate a M composite detection signals (M is an integer of N or greater) having a polarity pattern of the N polarities that are set to N detection signals differ from one another; and
regenerating the signal level of the N detection signals based on the M composite detection signals generated by the sensor unit,
wherein the N detection positions belongs to a portion of R detection position groups,
the R detection position groups include a 1st detection position group to a R-th detection position group, a r-th detection position group (r represents an integer from 1 to R), the K(r) units (K(r) represents an integer from 2 or greater) belongs to the detection position, K(r) polarities to be set to the K(r) detection signal obtained for the K(r) detection positions that belongings to the r-th detection position group is called a r-th partial polarity pattern, the positive or negative polarity set to the detection signal is represented by "1" or "−1", and the polarity set to the detection signal that is not added to the composite detection signal is represented by "0", the r-th partial polarity pattern is represented by the 1-row K(r)-columns r-th partial matrix respectively having values of "1", "−1", or "0", each of the M composite detection signals corresponds to any one of the r-th detection position groups, and K(r) composite detection signals correspond to the r-th detection position group, the K(r) composite detection signals correspond to the r-th detection position group, each of the K(r) polarity patterns used to generate the K(r) composite detection signals includes the one r-th partial polarity pattern and all the polarities other than the one r-th partial polarity pattern are "0", the K(r) r-th partial polarity patterns included in the K(r) polarity pattern are represented by the K(r)-rows K(r)-columns r-th polarity pattern matrix including the K(r) partial matrices, and regenerating the signal level includes regeneration of the signal levels of the K(r) detection signals obtained for the K(r) detection positions belonging to the r-th detection position group based on a calculation corresponding to multiplication of an inverse matrix with respect to the r-th polarity pattern matrix by the K(r) composite detection signal matrices with the K(r) composite detection signal as an element.

12. A non-transitory computer-readable recording medium in which a program for causing a computer to execute a control method of an input device for inputting information according to an proximity state of an object at a plurality of detection positions is recorded, the input device detecting the proximity state of the object at N detection positions, generates a composite detection signal corresponding to a sum of N detection signals obtained as a result of the detecting of the proximity state for the N detection positions, and has a sensor unit capable of controlling a positive or negative polarity for the detection signal having a signal level corresponding to the proximity state at each of the N detection positions, the control method comprises:
controlling the sensor unit so as to generate a M composite detection signals (M is an integer of N or greater) having a polarity pattern of the N polarities that are set to N detection signals differ from one another; and regenerating the signal level of the N detection signals based on the M composite detection signals generated by the sensor unit, wherein the N detection positions belongs to a portion of R detection position groups, the R detection position groups include a 1st detection position group to a R-th detection position group, a r-th detection position group (r represents an integer from 1 to R), the K(r) units (K(r) represents an integer from 2 or greater) belongs to the detection position, K(r) polarities to be set to the K(r) detection signal obtained for the K(r) detection positions that belongings to the r-th detection position group is called a r-th partial polarity pattern, the positive or negative polarity set to the detection signal is represented by "1" or "−1", and the polarity set to the detection signal that is not added to the composite detection signal is represented by "0", the r-th partial polarity pattern is represented by the 1-row K(r)-columns r-th partial matrix respectively having values of "1", "−1", or "0", each of the M composite detection signals corresponds to any one of the r-th detection position groups, and K(r) composite detection signals correspond to the r-th detection position group, the K(r) composite detection signals correspond to the r-th detection position group, each of the K(r) polarity patterns used to generate the K(r) composite detection signal includes one of the r-polarity patterns and all the polarities other than the r-polarity pattern are "0", the K(r) r-th partial polarity patterns included in the K(r) polarity pattern are represented by the K(r)-rows K(r)-columns r-th polarity pattern matrix including the K(r) partial matrices, and regenerating the signal level includes regeneration of the signal levels of the K(r) detection signals obtained for the K(r) detection positions belonging to the r-th detection position group based on a calculation corresponding to multiplication of an inverse matrix with respect to the r-th polarity pattern matrix by the K(r) composite detection signal matrices with the K(r) composite detection signal as an element.

\* \* \* \* \*